(12) United States Patent
Takiguchi et al.

(10) Patent No.: US 9,614,352 B2
(45) Date of Patent: Apr. 4, 2017

(54) LASER ELEMENT AND LASER DEVICE

(71) Applicant: HAMAMATSU PHOTONICS K.K., Hamamatsu-shi, Shizuoka (JP)

(72) Inventors: Yuu Takiguchi, Hamamatsu (JP); Yoshiro Nomoto, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/772,532

(22) PCT Filed: Mar. 7, 2014

(86) PCT No.: PCT/JP2014/056029
§ 371 (c)(1),
(2) Date: Sep. 3, 2015

(87) PCT Pub. No.: WO2014/136955
PCT Pub. Date: Sep. 12, 2014

(65) Prior Publication Data
US 2016/0036201 A1    Feb. 4, 2016

(30) Foreign Application Priority Data
Mar. 7, 2013   (JP) ................... 2013-045824

(51) Int. Cl.
*G02B 5/30*    (2006.01)
*H01S 5/10*    (2006.01)
(Continued)

(52) U.S. Cl.
CPC ............ *H01S 5/105* (2013.01); *G02B 27/286* (2013.01); *H01S 5/005* (2013.01); *H01S 5/12* (2013.01); *H01S 5/2018* (2013.01); *H01S 5/34313* (2013.01); *H01S 5/0287* (2013.01); *H01S 5/18* (2013.01); *H01S 5/42* (2013.01); *H01S 2301/14* (2013.01)

(58) Field of Classification Search
CPC ...... G02B 5/30; G02B 5/3008; G02B 5/3025; G02B 5/3083; G02B 5/32; G02B 27/28; G02B 27/286; G02B 2006/12128; G02B 2006/1213; H01S 3/063; H01S 3/0635; H01S 3/0675; H01S 5/34
USPC ............ 359/486.01, 486.02, 486.03, 489.01, 359/489.06, 489.07, 492.01; 372/7, 96, 372/98, 102, 106, 108
See application file for complete search history.

(56) References Cited

U.S. PATENT DOCUMENTS

| 2009/0135871 A1* | 5/2009 | Noda ............ G11B 7/127 372/44.01 |
| 2011/0188526 A1* | 8/2011 | Noda ............ H01S 5/105 372/41 |
| 2011/0261856 A1 | 10/2011 | Fattal et al. |

FOREIGN PATENT DOCUMENTS

| JP | 2003-023193 A | 1/2003 |
| JP | 2004-253811 A | 9/2004 |

(Continued)

*Primary Examiner* — Arnel C Lavarias
(74) *Attorney, Agent, or Firm* — Drinker Biddle & Reath LLP

(57) ABSTRACT

The coordinates of an unit configuration region R11 is (X1, Y1), and the coordinates of an unit configuration region Rmn is (Xm, Yn) (m and n are natural numbers). Rotation angles φ with respect to a center of apexes of an isosceles triangle are different according to coordinates, and at least three different rotation angles φ are contained in all of the photonic crystal layer.

7 Claims, 33 Drawing Sheets

(51) Int. Cl.
*H01S 5/12* (2006.01)
*G02B 27/28* (2006.01)
*H01S 5/00* (2006.01)
*H01S 5/20* (2006.01)
*H01S 5/343* (2006.01)
*H01S 5/18* (2006.01)
*H01S 5/028* (2006.01)
*H01S 5/42* (2006.01)

(56) References Cited

FOREIGN PATENT DOCUMENTS

| JP | 2007-258260 A | 10/2007 |
| JP | 2009-016370 A | 1/2009 |
| JP | 2009-076900 A | 4/2009 |
| JP | 2010-056446 A | 3/2010 |
| JP | 2012-119635 A | 6/2012 |
| JP | 2013-041948 A | 2/2013 |
| WO | WO-2011/108510 A1 | 9/2011 |

\* cited by examiner

Fig. 6

| | MATERIAL | CONDUCTIVITY | THICKNESS(nm) |
|---|---|---|---|
| CONTACT LAYER 8 | GaAs | P | 50~500 (200) |
| UPPER CLADDING LAYER 7 | AlGaAs | P | $1 \times 10^3$~$3 \times 10^3$ ($2 \times 10^3$) |
| PHOTONIC CRYSTAL LAYER 6 (PHASE MODULATION LAYER) | BASE LAYER 6A: GaAs BURIED LAYER 6B: AlGaAs | — | 50~200 (100) |
| UPPER LIGHT GUIDE LAYER 5 | UPPER LAYER: GaAs | — | 10~200 (50) |
| | LOWER LAYER: AlGaAs | P(I) | 10~100 (50) |
| ACTIVE LAYER 4 | MQW: AlGaAs/InGaAs | — | 10~100 (30) |
| LOWER LIGHT GUIDE LAYER 3 | AlGaAs | — | 0~300 (150) |
| LOWER CLADDING LAYER 2 | AlGaAs | N | $1 \times 10^3$~$3 \times 10^3$ ($2 \times 10^3$) |
| SEMICONDUCTOR SUBSTRATE 1 | GaAs | N | $80 \times 10^3$~$350 \times 10^3$ ($150 \times 10^3$) |

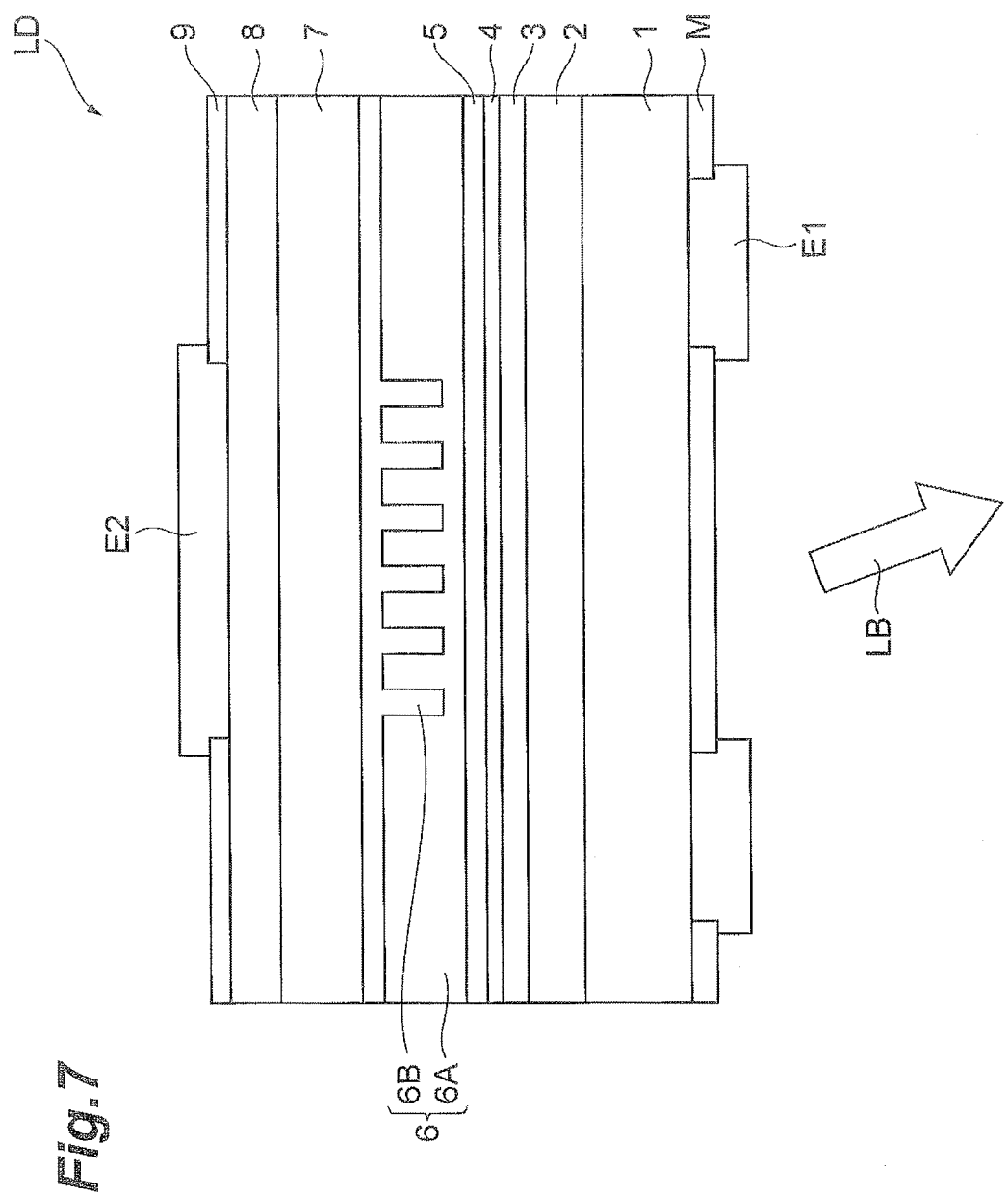

Fig.9
(A) $\phi=0$
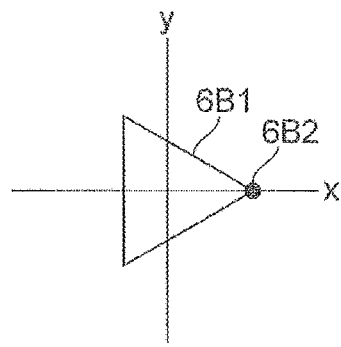
(B) $\phi=0.25\pi$
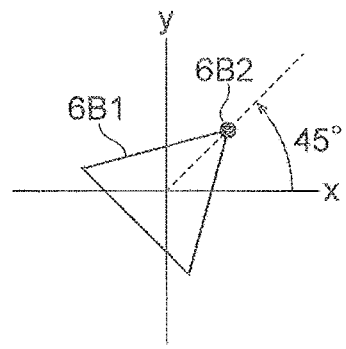
(C) $\phi=0.5\pi$
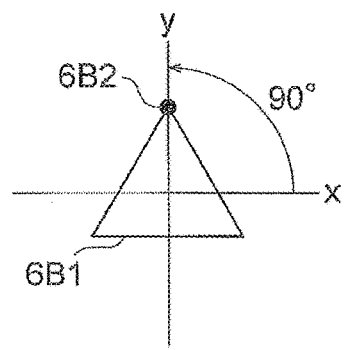
(D) $\phi=0.75\pi$
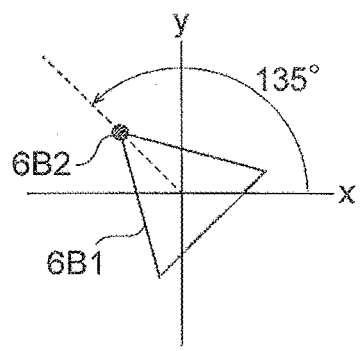
(E) $\phi=\pi$
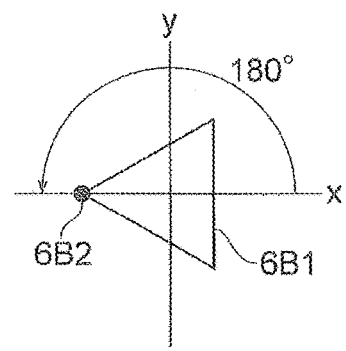
(F) $\phi=1.7\pi$
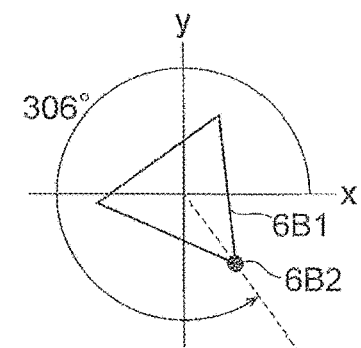

Fig.31
(A) 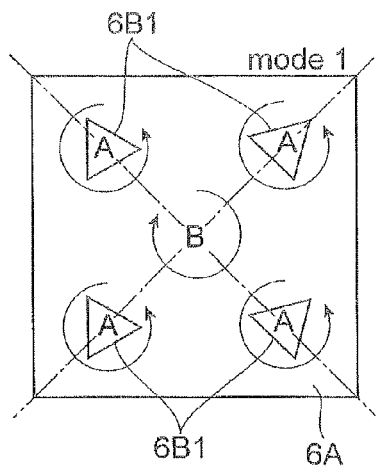
(B) 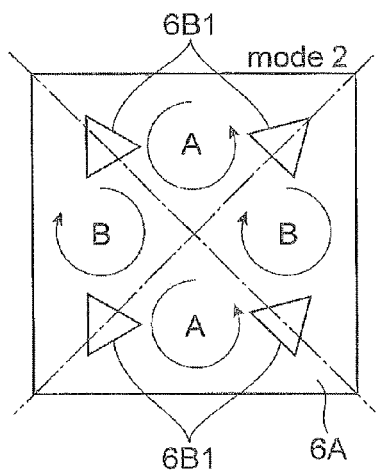
(C) 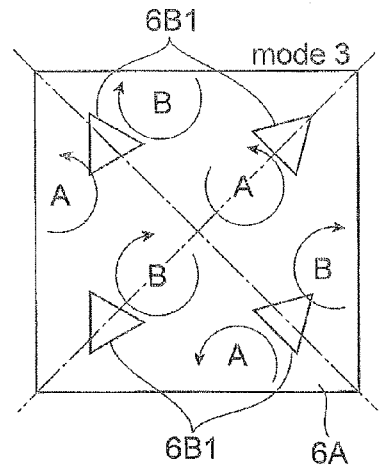
(D) 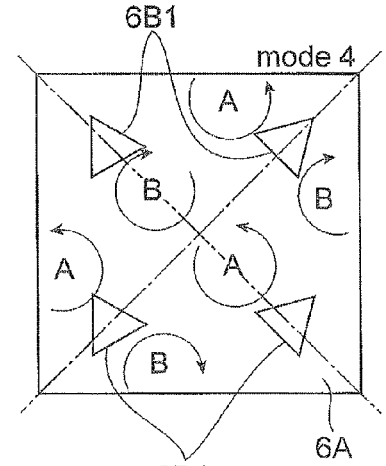

Fig.32
(A)
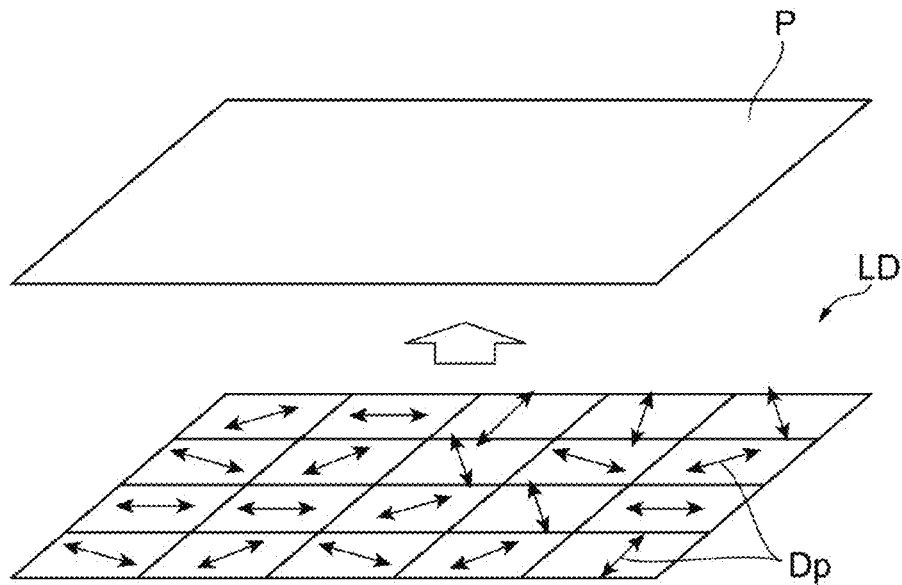
(B)
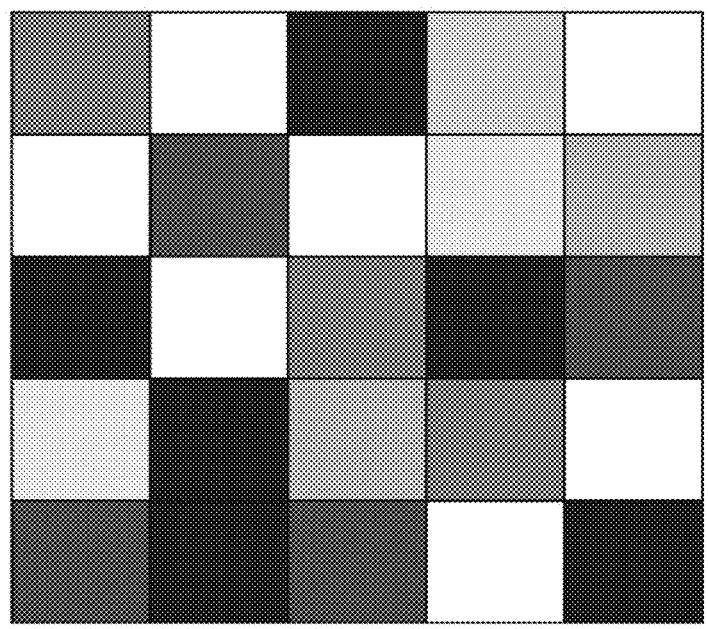

LASER ELEMENT AND LASER DEVICE

TECHNICAL FIELD

The present invention relates to a laser element and a laser device.

BACKGROUND ART

A photonic crystal layer used in a laser element of Patent Literature 1 is configured by periodically burying a plurality of different refractive index regions within a base layer that becomes a base. The laser element includes two-layered photonic crystal layers. Each of the photonic crystal layers has the same patterns periodically arranged, but the patterns are different for each photonic crystal layer.

Patent Literature 2 discloses an example of a technique related to an intensity of linear polarization of a laser beam. According to Patent Literature 2, conventionally, a plurality of circular different refractive index regions has been embedded in the base layer constituting the photonic crystal layer respectively at lattice point positions of a square lattice. In this case, a problem that polarization directions in a plane are not constant has been pointed out. That is, an electric field vector (polarization direction) is generated so as to surround the periphery of each of the different refractive index region, due to performance degradation of a mode, which occurs within the photonic crystal layer. In this regard, Patent Literature 2 discloses a technique in which the performance degradation of the mode is solved by disposing another different refractive index region at an asymmetric position deviated from the square lattice, and it is possible to arrange directions of the electric field vectors as a whole.

CITATION LIST

Patent Literature

Patent Literature 1 JP 2009-76900 A
Patent Literature 2 JP 2003-23193 A

SUMMARY OF INVENTION

Technical Problem

However, a conventional laser element cannot emit a laser beam only in one desired direction, and therefore, it is hard to constitute a multi-direction laser output device.

The present invention has been made in an effort to solve the aforementioned problems and an object of the present invention is to provide a laser element and a laser device capable of emitting a laser beam only in one desired direction.

Solution to Problem

To solve the above problems, the present inventors have been found from the result of intensive studies on a laser element structure that it is possible to emit laser beams having various patterns by devising a shape of different refractive index region in a photonic crystal layer, and changing a rotation angle with respect to a center of one point on a contour of its plane shape according to coordinates. The plane shape is an approximate triangle, an approximate ellipse in which a flatness ratio is not zero, or a non-rotational symmetric shape, and due to this, an electric field vector remains without being offset along a specific direction in the plane shape.

In addition, the approximate triangle or the approximate ellipse is designed to have a triangle or a ellipse, but are intended to include shapes which are distorted little upon manufacture.

Specifically, a laser element according to an aspect includes a photonic crystal layer on which laser light is incident, wherein the photonic crystal layer includes a base layer formed of a first refractive index medium; and a plurality of different refractive index regions formed of a second refractive index medium having a refractive index different from that of the first refractive index medium and disposed in the base layer, the plurality of different refractive index regions has a plane shape that is an approximate triangle, an approximate ellipse in which a flatness ratio is not zero, or a non-rotational symmetric shape, a unit configuration region is formed of one different refractive index region, in the unit configuration region, a rotation angle of one point on a contour of the plane shape with respect to a central position of the different refractive index region is denoted by $\phi$, in an XY plane including an X axis and an Y axis, a plurality of unit the configuration regions is two-dimensionally arranged, XY coordinates of each of the unit configuration region is given to a central position of the different refractive index region, and, when the XY coordinates of the unit configuration region are (X, Y), the rotation angle $\phi$ are different depending on positions and at least three different rotation angles $\phi$ are contained in all of the photonic crystal layer. In the present invention, it is possible to obtain laser beams having various patterns by combining three or four sets of intensity patterns. At this time, since the present invention is based on the principle that the intensity of each area is modulated by changing the rotational angle $\phi$, three or more different rotational angles are inevitably included.

In addition, the laser element includes: an active layer configured to emit the laser light; upper and lower cladding layers between which the active layer is interposed; and the photonic crystal layer disposed between the upper or lower cladding layer and the active layer.

In addition, a laser device includes: the laser element; and a polarizing plate disposed to face a light emitting surface of the laser element.

Advantageous Effects of Invention

According to the laser element and the laser device of the present invention, it is possible to emit laser beams having various patterns.

BRIEF DESCRIPTION OF DRAWINGS

FIG. 6 is a table showing a relationship between material, a conductivity type, and a thickness (nm) of components constituting a laser element.

FIG. 7 is a diagram illustrating a longitudinal sectional configuration of a fourth laser element.

FIG. 9 is a diagram for describing a positional relationship of different refractive index regions.

FIG. 31 is a diagram illustrating a mode provided by a photonic crystal layer.

FIG. 32 is a diagram illustrating a laser device including a laser element and a polarizing plate.

DESCRIPTION OF EMBODIMENTS

Figure 1:
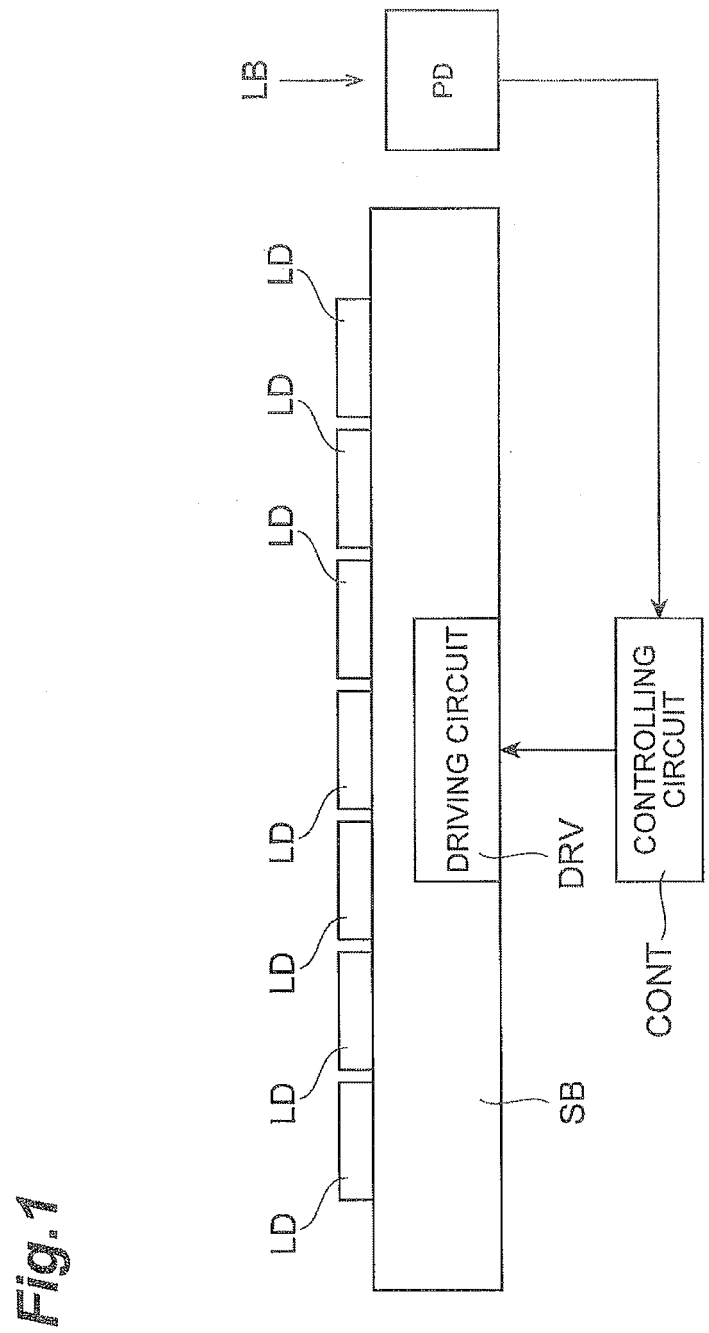
FIG. 1 is a diagram illustrating a configuration of a laser device.

Hereinafter, exemplary embodiments of a laser element and a laser device will be described. Like reference numerals are used to denote like structural elements and redundant descriptions thereof will be omitted.

FIG. 1 is a diagram illustrating a configuration of a laser device.

A plurality of laser elements LD is one-dimensionally or two-dimensionally arranged on a support board SB. Each of the laser elements LD is driven by a driving circuit DRV provided in a rear surface of or inside the support board SB. That is, the driving circuit DRV supplies a driving current of each of the laser elements LD according to an instruction from a controlling circuit CONT. For example, the driving current is supplied to the two-dimensionally arranged laser elements LD according to a sequential order of addresses where the laser elements LD are arranged. A laser beam is emitted from the laser element LD in a direction perpendicular to the board. When the laser elements LD are sequentially lighted in the order of addresses, the object is scanned by the laser beam in a pseudo manner. A laser beam LB reflected by the target object can be detected by a photo-detector PD, such as a photo-diode.

A detection signal indicating a laser beam intensity, which is detected by the photo-detector PD, is input to the controlling circuit CONT. When the laser elements LD are pulse-driven, the photo-detector PD can measure a time from an emission timing to a detection timing of the laser beam, that is, measure a distance to the target object.

The laser device can be used for the following purposes. For example, the laser device can be used to emit the laser beam to the target object and to measure a distance to a laser beam irradiation position, measuring a three-dimensional shape of the target object. When three-dimensional shape data is used, various machining devices or medical devices can use the three-dimensional shape data. In addition, when the laser beam is output to a moving object such as a vehicle in multiple directions, it is possible to measure a distance according to a direction toward an obstacle, and to use a brake or a handle as a safety apparatus that performs automatic control or assist control, according to the distance.

A detailed structure of a laser element to be used in the aforementioned laser device will be described below. The laser element can emit laser light having various intensity patterns.

Figure 2:
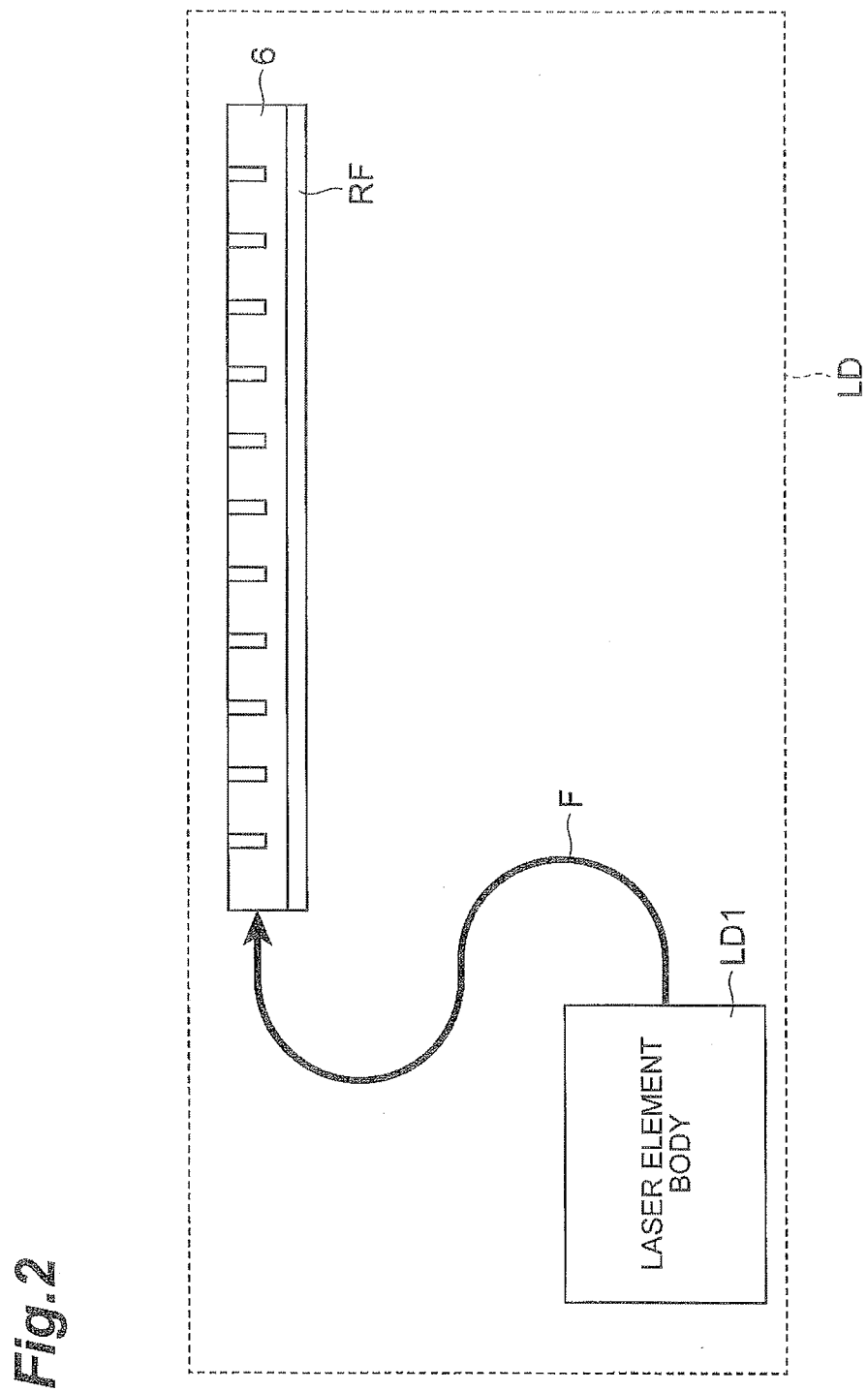
FIG. 2 is a diagram illustrating a configuration of a first laser element.

FIG. 2 is a diagram illustrating a configuration of a first laser element.

The laser element LD includes a photonic crystal layer (photonic crystal layer) 6 on which laser light is incident. The laser light is incident into the photonic crystal layer 6 through an optical fiber F or directly, from a laser element body LD1, such as a semiconductor laser element. The optical fiber F is attached to a side surface of the photonic crystal layer 6. There may be provided a plurality of optical fibers F. In this case, the laser light is incident into the photonic crystal layer 6 from the plurality of optical fibers F arranged along the side surface of the photonic crystal layer 6. The laser light which is incident into the photonic crystal layer 6 forms a predetermined mode according to a photonic crystal lattice of the photonic crystal layer 6 and is emitted, as a laser beam LB, to the outside in a direction perpendicular to a surface of the photonic crystal layer 6. A reflection film RF which is formed of metal, such as aluminum, is provided on a lower surface of the photonic crystal layer 6. The laser beam traveling in a direction of the lower surface of the photonic crystal layer 6 is reflected by the reflection film RF and is directed to a direction of an upper surface of the photonic crystal layer 6. Therefore, the intensity of the laser beam LB increases by the reflection film RF.

Figure 3:
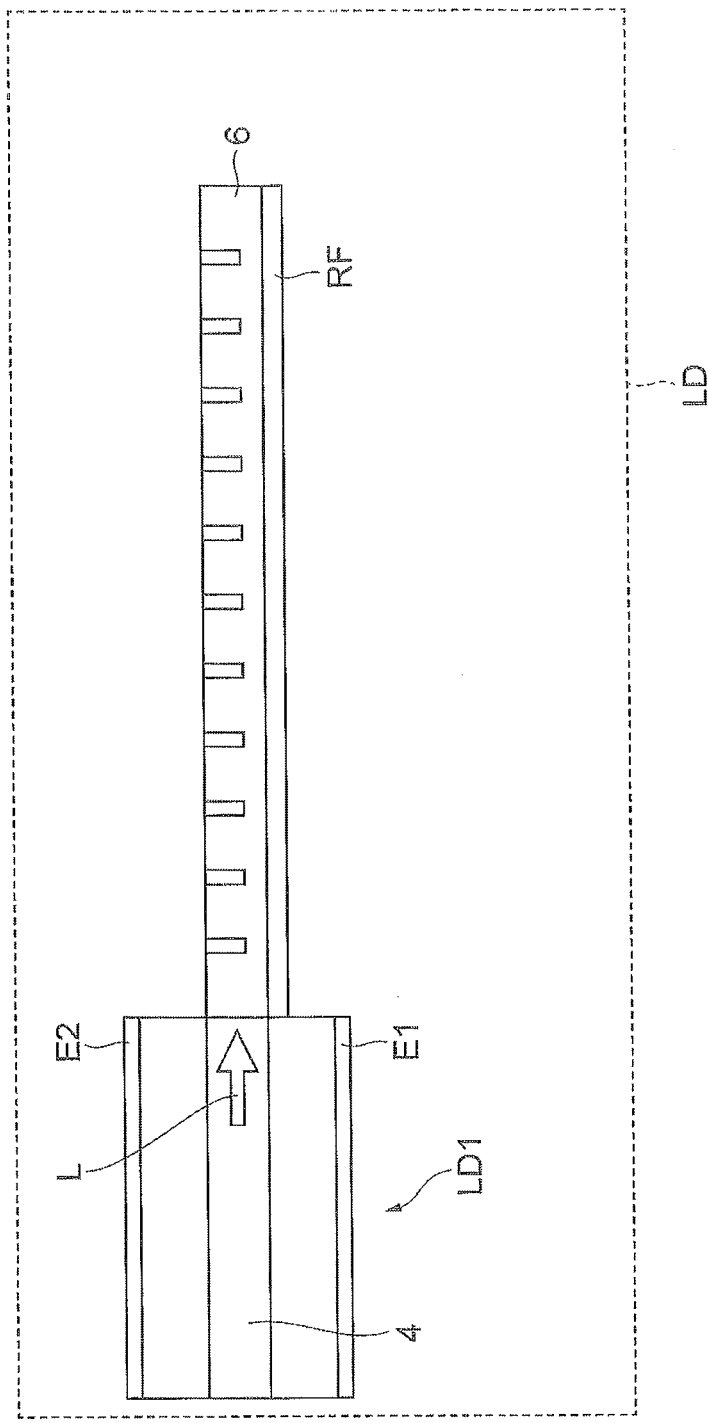
FIG. 3 is a diagram illustrating a configuration of a second laser element.

FIG. 3 is a diagram illustrating a configuration of a second laser element.

The laser element LD is configured by disposing the side surface of the aforementioned photonic crystal layer 6 directly adjacent to an end surface of an edge-emitting laser element body LD1. The side surface of the photonic crystal layer 6 may be fixed to the end surface of the laser element body LD1 by using adhesive or the like. Also, it is possible to continuously form both of the laser element body LD1 and the photonic crystal layer 6 from one semiconductor substrate, by adjusting a thickness of the photonic crystal layer 6. The laser element body LD1 is configured by laminating a compound semiconductor layer. A first electrode E1 is provided on a lower surface of a corresponding laminate and a second electrode E2 is provided on an upper surface of the laminate. By supplying a driving current between the first electrode E1 and the second electrode E2, an active layer 4 of the laser element body LD1 emits light, and laser light L is incident into the photonic crystal layer 6. The incident laser light forms a predetermined mode inside the photonic crystal layer 6 and emits a laser beam LB in a direction perpendicular to a substrate surface. A reflection film RF as described above is provided on a lower surface of the photonic crystal layer 6 and a similar effect as described above is achieved.

Figure 4:
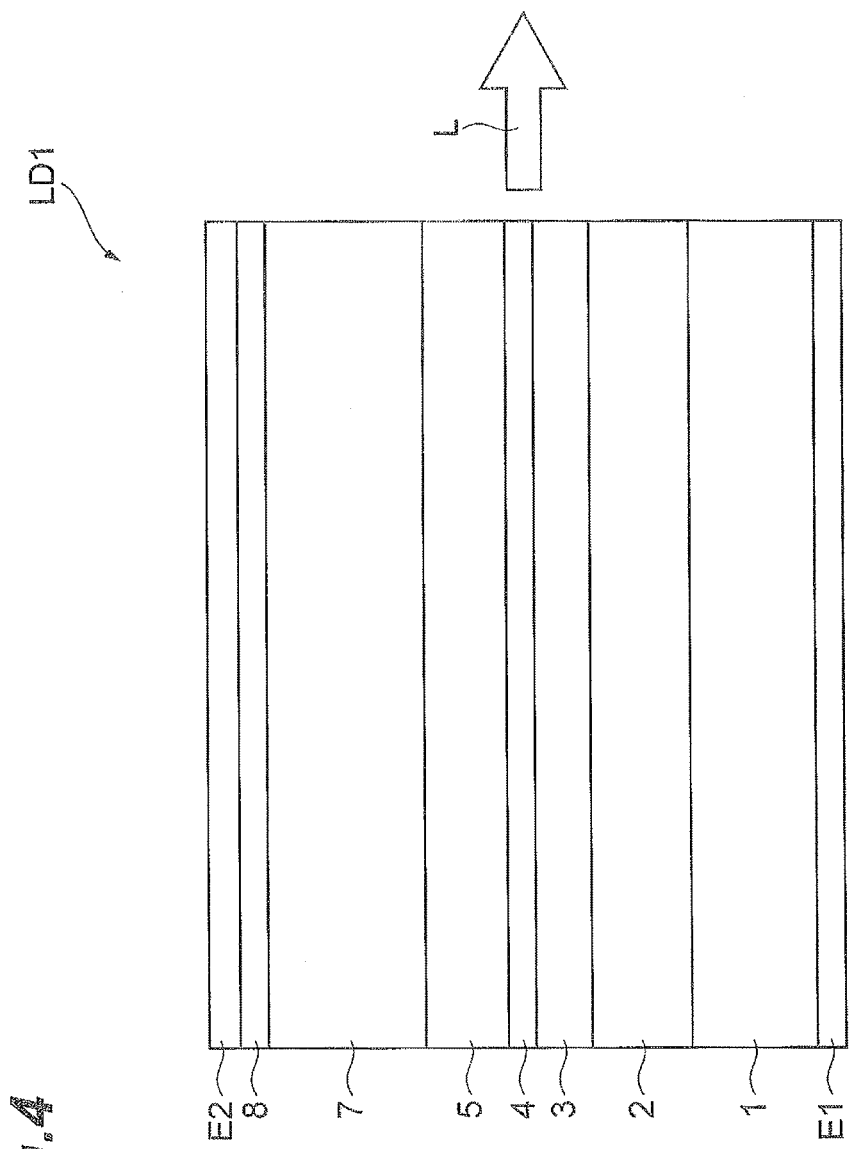
FIG. 4 is a diagram illustrating a configuration of a laser element body portion.

FIG. 4 is a diagram illustrating a configuration of the aforementioned laser element body LD1.

On the semiconductor substrate 1, a lower cladding layer 2, a lower light guide layer 3, an active layer 4, an upper light guide layer 5, an upper cladding layer 7, and a contact layer 8 are sequentially laminated. A first electrode E1 is provided on a lower surface of the semiconductor substrate 1, and a second electrode E2 is provided on an upper surface of the contact layer 8. When a driving current is supplied between the first electrode E1 and the second electrode E2, recombination of electrons and holes occur inside the active layer 4 and therefore, the active layer 4 emits light. A carrier to contribute light emission and generated light are effectively trapped by the upper and lower light guide layers 3 and 5 and the cladding layers 2 and 7 therebetween. In addition, the first electrode E1 is provided on an entire lower surface of the semiconductor substrate 1 and the second electrode E2 is provided on a partial area of an upper layer of the contact layer 8 so as to extend along a resonant length direction (an emission direction of the laser light L).

As described above, the laser light L emitted from the laser element body LD1 is incident into the photonic crystal layer 6.

Figure 5:
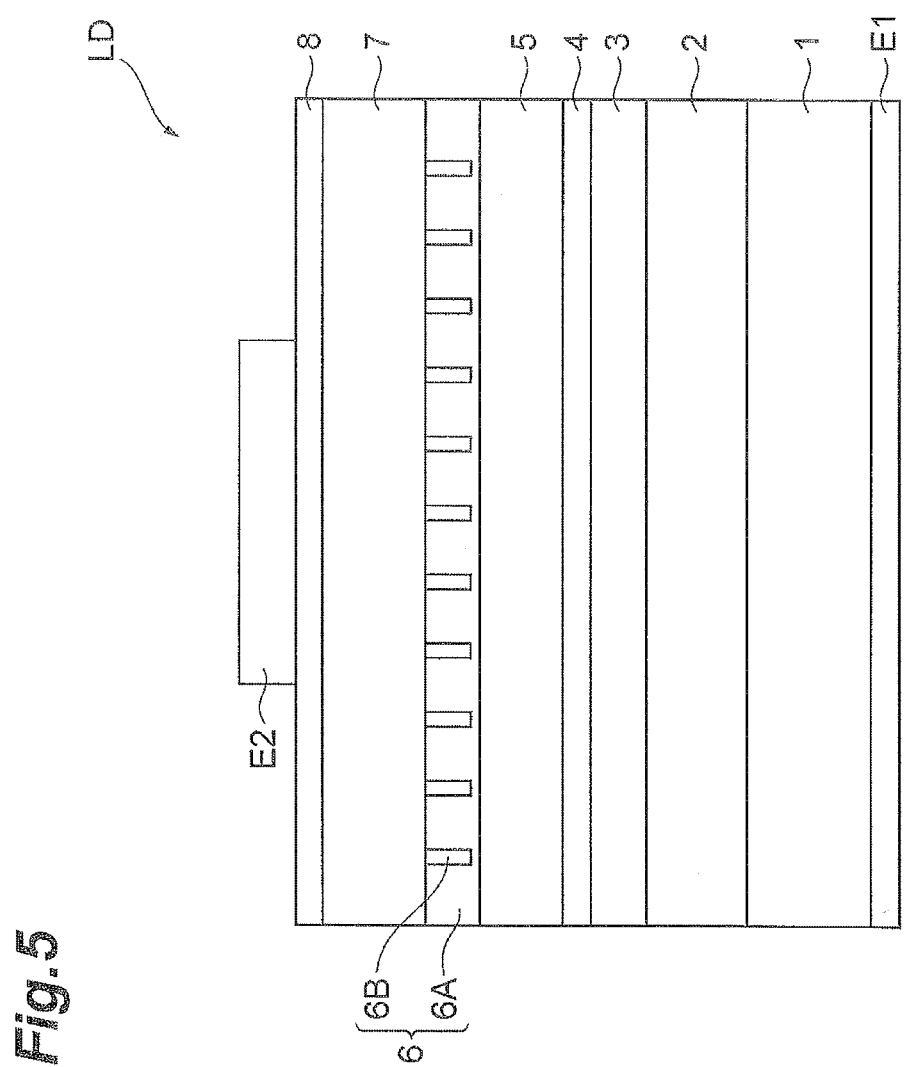
FIG. 5 is a diagram illustrating a longitudinal sectional configuration of a third laser element.

FIG. 5 is a diagram illustrating a longitudinal sectional configuration of a third laser element.

The laser element LD has a structure in which a photonic crystal layer 6 is incorporated into a laser element body illustrated in FIG. 4, forming a so-called photonic crystal surface emission laser.

The laser element LD includes an active layer 4 that generates laser light, an upper cladding layer 7 and a lower cladding layer 2 between which the active layer 4 is interposed, and light guide layers 3 and 5 which are disposed between the upper cladding layer 7 and the lower cladding layer 2 and between which the active layer 4 is interposed. The photonic crystal layer 6 is disposed between the upper cladding layer 7 and the active layer 4. In the structure illustrated in FIG. 5, a second electrode E2 is provided in a central area of a contact layer 8.

In the structure, on a semiconductor substrate 1, the lower cladding layer 2, the lower light guide layer 3, the active layer 4, the upper light guide layer 5, the photonic crystal layer 6, the upper cladding layer 7, and the contact layer 8 are sequentially laminated. A first electrode E1 is provided in a lower surface of the semiconductor substrate 1, and the second electrode E2 is provided in an upper surface of the contact layer 8. When a driving current is supplied between the first electrode E1 and the second electrode E2, recombination of electrons and holes occur inside the active layer 4, and the active layer 4 emits light. A carrier to contribute light emission and generated light are effectively trapped by the upper and lower light guide layers 3 and 5 and the cladding layers 2 and 7 therebetween.

The laser light emitted from the active layer 4 is incident into the photonic crystal layer 6, forming a predetermined mode. In addition, the photonic crystal layer 6 includes a base layer 6A formed of a first refractive index medium and a plurality of different refractive index regions 6B formed of a second refractive index medium having a refractive index different from that of the first refractive index medium and disposed inside the base layer 6A. The plurality of different refractive index regions 6B includes a periodic structure. The laser light incident into the photonic crystal layer 6 is emitted as a laser beam perpendicularly to a substrate surface, through the upper cladding layer 7, the contact layer 8, and the upper electrode E2.

FIG. 6 is a table showing a relationship between material, a conductivity type, and a thickness (nm) of compound semiconductor layers constituting a laser element.

The materials of each element are as illustrated in FIG. 6. The semiconductor substrate 1 is made of GaAs and the lower cladding layer 2 is made of AlGaAs. The lower light guide layer 3 is made of AlGaAs, the active layer 4 is made of a multiple quantum well structure MQW (barrier layer: AlGaAs/well layer: InGaAs), and the upper light guide layer 5 is made of an upper layer AlGaAs/a lower layer GaAs. In the photonic crystal layer (refractive index modulation layer) 6, the base layer 6A is made of GaAs, and the different refractive index region 6B (buried layer) which is embedded in the base layer 6A is made of AlGaAs, the upper cladding layer 7 is made of AlGaAs, and the contact layer is made of GaAs.

Note that, as illustrated in FIG. 6, each of the layers is doped with a first conductivity type (N-type) impurity or a second conductivity type (P-type) impurity (impurity concentration is $1\times10^{17}$ to $1\times10^{21}/cm^3$), and an area which is not doped with any impurity intentionally is an intrinsic (I-type). The concentration of the I-type impurity is $1\times10^{15}/cm^3$ or less.

Moreover, an energy band gap of the cladding layer is larger than an energy band gap of the light guide layer, and the energy band gap of the light guide layer is set to be larger than an energy band gap of a well layer of the active layer 4. In AlGaAs, by changing a composition ratio of Al, it is possible to easily change the energy band gap and refractive index. In $Al_xGa_{1-x}As$, when a composition ratio X of Al having a relatively small atomic radius is reduced (increased), the energy band gap having a positive correlation with the Al decreases (increases). When InGaAs is formed by mixing In having a large atomic radius with GaAs, the energy band gap decreases. That is, the Al composition ratio of the cladding layer is larger than the Al composition ratio of the light guide layer, and the Al composition ratio of the light guide layer is equal to or larger than the Al composition of a barrier layer (AlGaAs) of the active layer. The Al composition ratio of the cladding layer is set to 0.2 to 0.4, for example, 0.3. The Al composition ratios of the light guide layer and the active layer are set to 0.1 to 0.15, for example, 0.1.

Also, the thicknesses of the layers are as illustrated in FIG. 6, in which a numerical range represents preferable values, and the numbers in parentheses indicate the optimum values. Incidentally, the photonic crystal layer is configured to change a polarization direction in the XY plane of the unit configuration regions, and also to match phases in respective regions. Since a phase of emitted laser light is dependent on the characteristics of the photonic crystal layer, the photonic crystal layer functions as a phase modulation layer.

Figure 28:
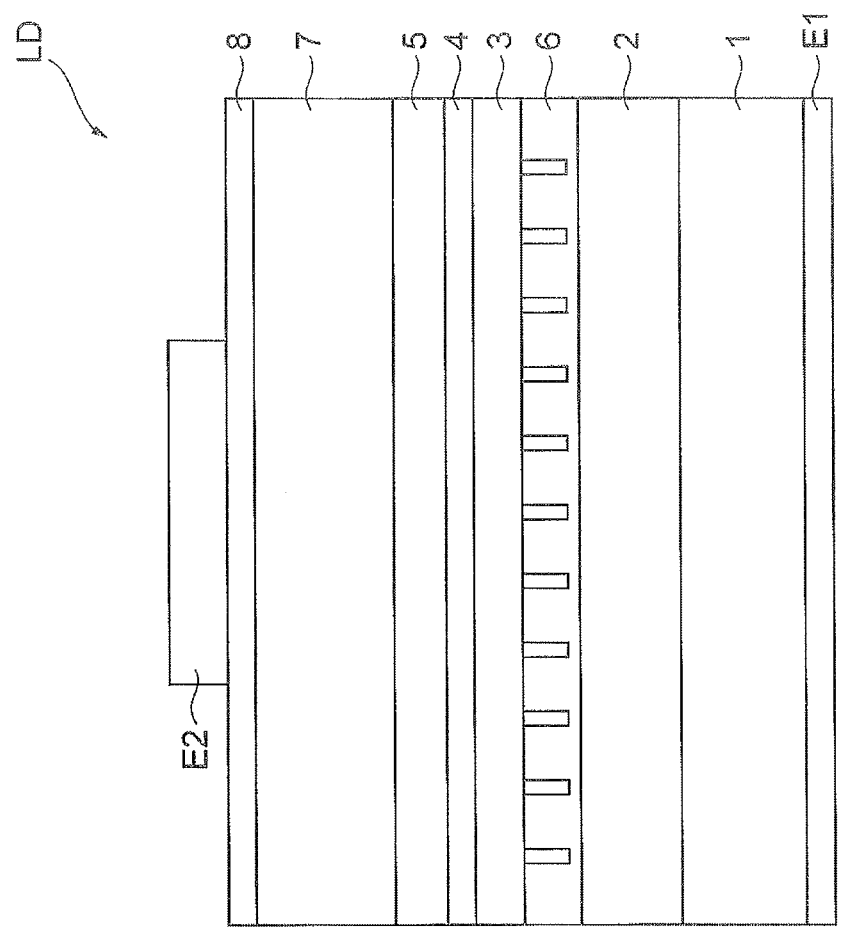
FIG. 28 is a diagram illustrating a longitudinal sectional configuration of a laser element.

As illustrated in FIG. 28, the photonic crystal layer 6 may be provided between the lower cladding layer 2 and the active layer 4. In this case, the photonic crystal layer 6 can be disposed at a position interposed between the lower cladding layer 2 and the light guide layer 3. This structure also achieves the same effect as described above. That is, the laser light emitted from the active layer 4 is incident into the photonic crystal layer 6, forming a predetermined mode. The laser light incident into the photonic crystal layer 6 is emitted as a laser beam in a direction perpendicular to a substrate surface, through the lower light guide layer, the active layer 4, the upper light guide layer 5, the upper cladding layer 7, the contact layer 8, and the upper electrode E2. The laser beam can also be emitted at an angle from the direction perpendicular to the substrate surface.

FIG. 7 is a diagram illustrating a longitudinal sectional configuration of a fourth laser element.

A structure of the laser element LD is substantially similar to that illustrated in FIG. 5, except for a shape of an electrode. That is, a first electrode E1 provided in a lower surface of a semiconductor substrate 1 is an aperture electrode having an aperture in a central portion thereof, and an antireflection film M is provided within and around an aperture of the first electrode E1. The antireflection film M is formed of a dielectric single-layer film, such as silicon nitride (SiN) or silicon dioxide ($SiO_2$), or a dielectric multilayer film. As the dielectric multilayer film, a film can be used, which generated by appropriately laminating two or more dielectric layers selected from a dielectric layer group including, for example, titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), and zirconium oxide ($ZrO_2$). For example, a film having a thickness of $\lambda/4$ as an optical thickness for light with a wavelength $\lambda$ is laminated. In addition, a reflection film or an antireflection film can be formed by sputtering.

A second electrode E2 is provided on an upper surface of a contact layer 8. If required, an insulation film 9 is coated on an area other than an area in which the contact electrode E2 is formed, protecting a rear surface.

In this structure, a lower cladding layer 2, a lower light guide layer 3, an active layer 4, an upper light guide layer 5, a photonic crystal layer 6, an upper cladding layer 7, and the contact layer 8 are sequentially laminated on a semiconductor substrate 1. When a driving current is supplied between the first electrode E1 and the second electrode E2, recombination of electrons and holes occur inside the active layer 4, and therefore, the active layer 4 emits light. A carrier to contribute light emission and generated light are effectively trapped by the upper and lower light guide layers 3 and 5 and the cladding layers 2 and 7 therebetween.

The laser light emitted from the active layer 4 is incident into the photonic crystal layer 6, forming a predetermined mode. In addition, the photonic crystal layer 6 includes a base layer 6A formed of a first refractive index medium and a plurality of different refractive index regions 6B formed of a second refractive index medium having a refractive index different from that of the first refractive index medium and disposed inside the base layer 6A. The plurality of different refractive index regions 6B has a periodic structure. The laser light incident into the photonic crystal layer 6 is emitted to the outside as a laser beam LB, through the upper light guide layer 5, the active layer 4, the lower light guide layer 3, the lower cladding layer 2, the semiconductor substrate 1, and the antireflection film M. In a lower surface of the semiconductor substrate 1, the first electrode E1 is not provided in an area facing the second electrode E2, and the laser beam LB is emitted to the outside from the lower surface. A different refractive index region 6B may be embedded within a hole of a base layer 6A, and thereafter, a modified refractive index coating layer which is formed of the same material as the different refractive index region 6B may be deposited on the base layer 6A.

Figure 8:
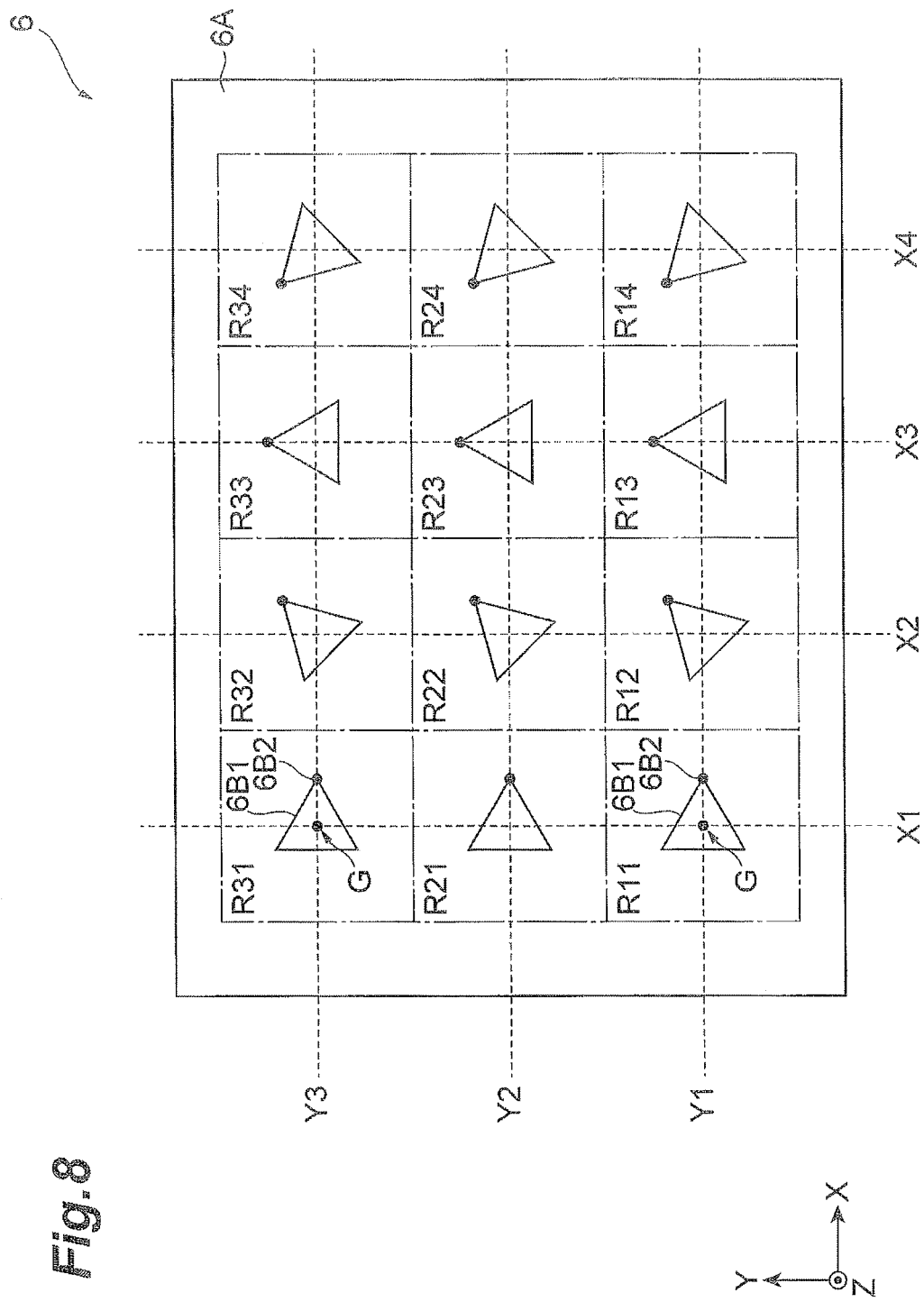
FIG. 8 is a plan view of a photonic crystal layer.

FIG. 8 is a plan view of the aforementioned photonic crystal layer 6.

The photonic crystal layer 6 includes the base layer 6A formed of a first refractive index medium and the different refractive index region 6B formed of a second refractive index medium having a refractive index different from that of the first refractive index medium. The different refractive index region 6B is a compound semiconductor, but may be a hole filled with argon, nitrogen or air.

A plurality of different refractive index regions 6B each has an XY plane having an approximate triangle, and the thickness direction of plurality of different refractive index regions 6B is the Z-axis.

The different refractive index region 6B forms a continuous figure, and one tip position is denoted by 6B2, and a body portion inside a hole is denoted by a different refractive index region 6B1. In this case, unit configuration regions R11 to R34 are defined. Each of the unit configuration regions R11 to R34 is formed of one different refractive index region 6B1. In the unit configuration regions R11 to R34, $\phi$ denotes a rotation angle of one point 6B2 on a contour (indicated by the black dot on a contour) with respect to (a center of) the different refractive index region 6B1. When the rotation angle $\phi$ coincides with the positive direction of the X axis, $\phi=0°$ is defined. In this case, the one point on the contour is set as the apex of a triangle.

As illustrated in FIG. 8, in the photonic crystal layer 6, the plurality of unit configuration regions R11 and R34 is two-dimensionally arranged in an XY plane including an X axis and an Y axis, and XY coordinates of the unit configuration regions R11 and R34 are respectively given as central positions G of each of the first different refractive index regions 6B1. The XY coordinates (coordinates of the center G) of each of the unit configuration regions R11 and R34 are given as (X, Y).

The coordinates of the unit configuration region R11 is (X1, Y1), and the coordinates of the unit configuration region Rmn is (Xm, Yn) (m and n are natural numbers). Referring to FIG. 8, the rotation angle $\phi$ increase at equal intervals in proportion to an increase in coordinate on the X axis, but is not changed in spite of a change in coordinate on the Y axis. That is, the rotation angle $\phi$ is a function of X. The function is given as, for example, $\phi=\phi_0+aX$ (where, $\phi_0$ is an integer and a is an integer other than 0). In a light emitting surface, a polarization modulation pattern according to a position is obtained, but it is possible to allow conversion into an intensity modulation pattern by transmission through a polarization plate. When the Fourier transformation is performed on the intensity modulation pattern through a convex lens, it is possible to obtain a beam spot having a desired shape. For example, it is possible to convert a shape of the laser beam into a spot (a circle). The function can be applied to all or a specific area of the photonic crystal layer.

FIG. 9 is a diagram for describing an example of a positional relationship of different refractive index regions.

FIG. 9(A) illustrates the case of φ=0 (rad), FIG. 9(B) illustrates the case of φ=0.25π (rad), FIG. 9(C) illustrates the case of φ=0.5π (rad), FIG. 9(D) illustrates the case of φ=0.75π (rad), FIG. 9(E) illustrates the case of φ=π (rad), and FIG. 9(F) illustrates the case of φ=1.7π (rad).

Figure 10:
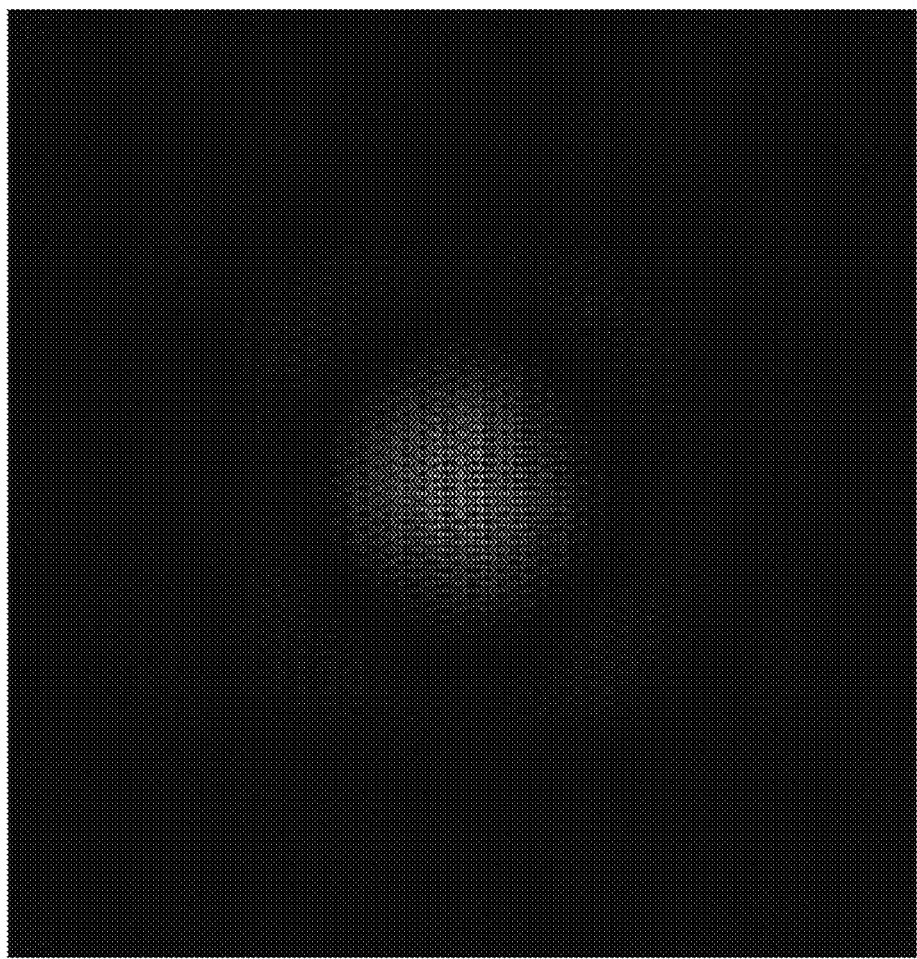
FIG. 10 is a diagram illustrating an intensity distribution pattern of emission light.
Figure 33:
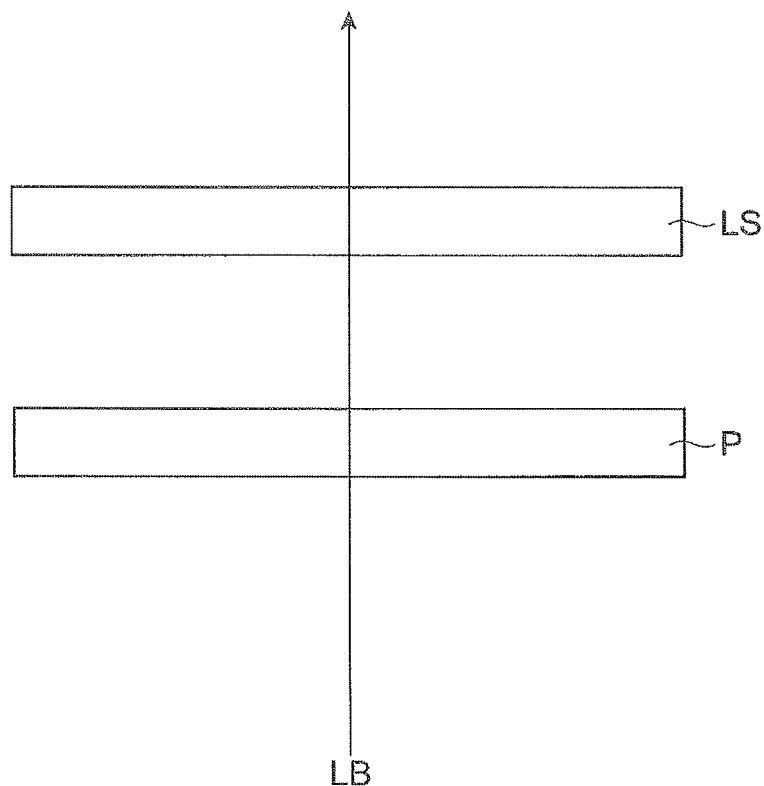
FIG. 33 is a diagram illustrating main portions of a laser device including a polarizing plate and a lens.

FIG. 10 is a diagram illustrating an intensity distribution pattern of an emission light after passing through a polarizing plate P (FIG. 33).

Figure 11:
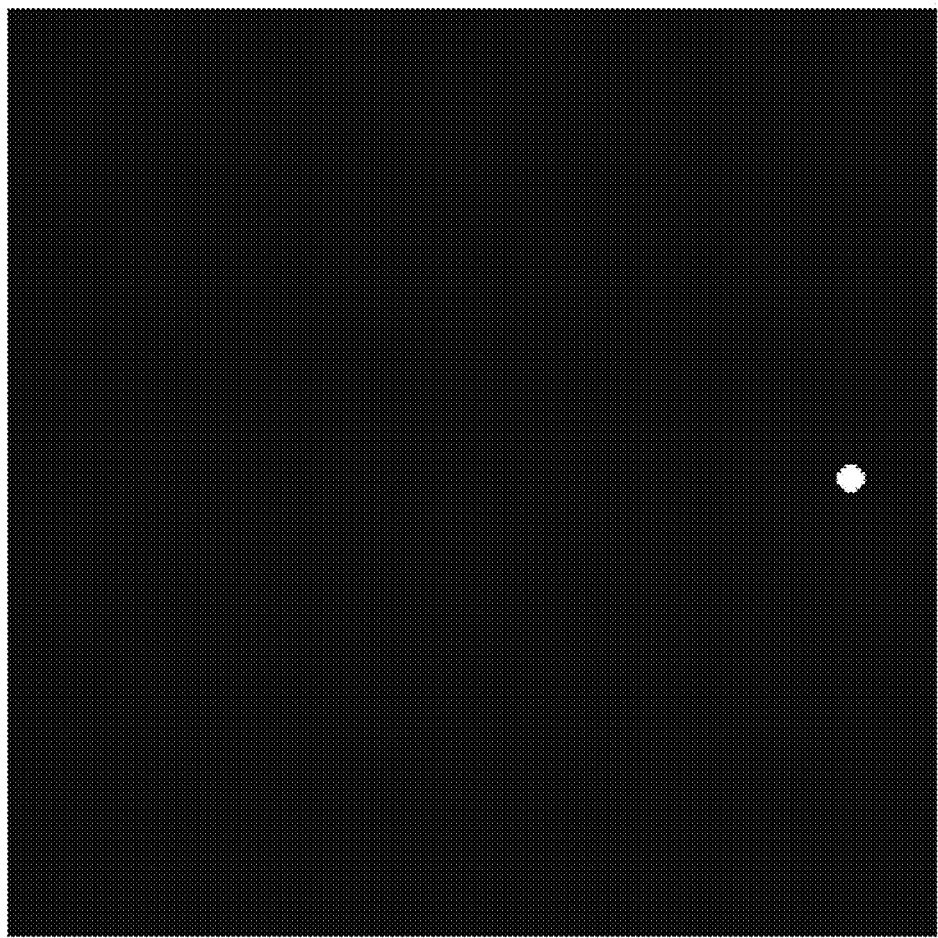
FIG. 11 is a far-field image after the Fourier transformation.

In FIG. 10, colors represent intensity distribution (corresponding to φ) of laser light at each position (coordinates) and intensities of 0 to the maximum correspond to black to white. In addition, an intensity corresponds to a polarizing direction. In this case, a shape or far-field image of the laser beam after passing through a lens or a hologram are as illustrated in, for example, FIG. 11. A center of FIG. 10 corresponds to a plane perpendicular direction of a device, that is a direction perpendicular to the photonic crystal layer. A white portion corresponds to a shape of laser beam. In this case, the shape of the laser beam is a spot (circle).

Figure 12:
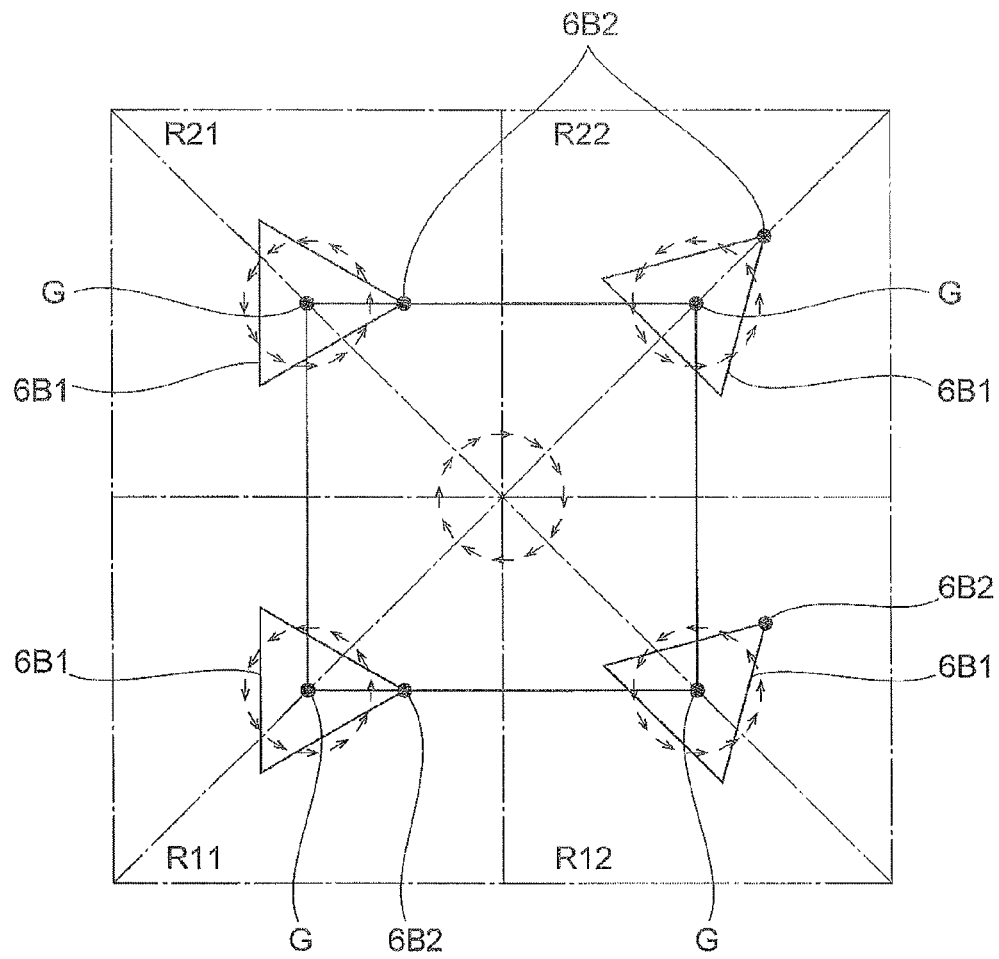
FIG. 12 is a diagram illustrating a positional relationship between different refractive index regions and an electric field distribution.

FIG. 12 is a diagram illustrating a positional relationship between different refractive index regions and an electric field distribution.

FIG. 12 illustrates plane states of four unit configuration regions R11, R12, R21, and R22 which are adjacent to one another. A mode in which an electric field is distributed so as to surround the first different refractive index region 6B1 by laser light is generated inside the photonic crystal layer 6. There has been known the fact that, on condition that a lattice interval is almost identical to a wavelength in a structure in which the first different refractive index regions 6B1 are arranged in a square lattice shape, four types of modes are generated from their symmetry. Since the four types of modes have different frequencies, the mode in which the electronic field is distributed so as to surround the first different refractive index region 6B1 as described above, by appropriately selecting a frequency of light incident to the photonic crystal layer. In this mode, each of the electric field vectors indicated by arrows is disposed to rotate around the center G. The central positions G of the different refractive index regions 6B1 coincide with the central positions of these electric field vectors, and a square is configured by a line connecting the central positions G of four different refractive index regions 6B1. That is, the different refractive index regions 6B are disposed at lattice point positions of a square lattice. An electric field vector rotating around the intersection points of the configured square-shaped diagonal line also exists.

When there is one tip point 6B2 in each of the unit configuration regions, it is likely that only an electric field vector in a specific direction effectively remains and works and the remaining electric field vector is offset respect to the one tip. According to the boundary conditions of Maxwell's equations, electric field components in the XY plane vary depending on a difference in dielectric constant between inner and outer areas of a refractive index boundary. As a result, modulation in a spatial phase is caused. That is, only the electric field vector (polarization direction) passing through the one tip point 6B2 remains as a point light source of linearly polarized light. In order words, it can be considered that a plurality of point light sources is distributed which have different polarization directions in a two-dimensional plane on the photonic crystal layer 6. In addition, it can be considered that a far-field image of distribution of the point light sources is obtained by performing Fourier transformation on the point light sources.

In this case, a plane shape of the different refractive index region 6B1 having an approximate triangle may have the following shape and a polarization direction.

When the plane shape is an equilateral triangle or an isosceles triangle having a lower side which is shorter than two other sides, a polarization component (electric field vector) remains in a direction perpendicular to a direction from the lower side to an apex. In the case of an isosceles right triangle, a polarization component parallel to or perpendicular to a hypotenuse remains. In the case of a right triangle, a polarization component parallel to a hypotenuse or a polarization component perpendicular to the hypotenuse remains. Since a polarization azimuth (phase) is changed according to the shape as described above, it is possible to change a phase of laser light by rotating each different refractive index region around a thickness direction (Z axis) of the photonic crystal layer.

Figure 13:
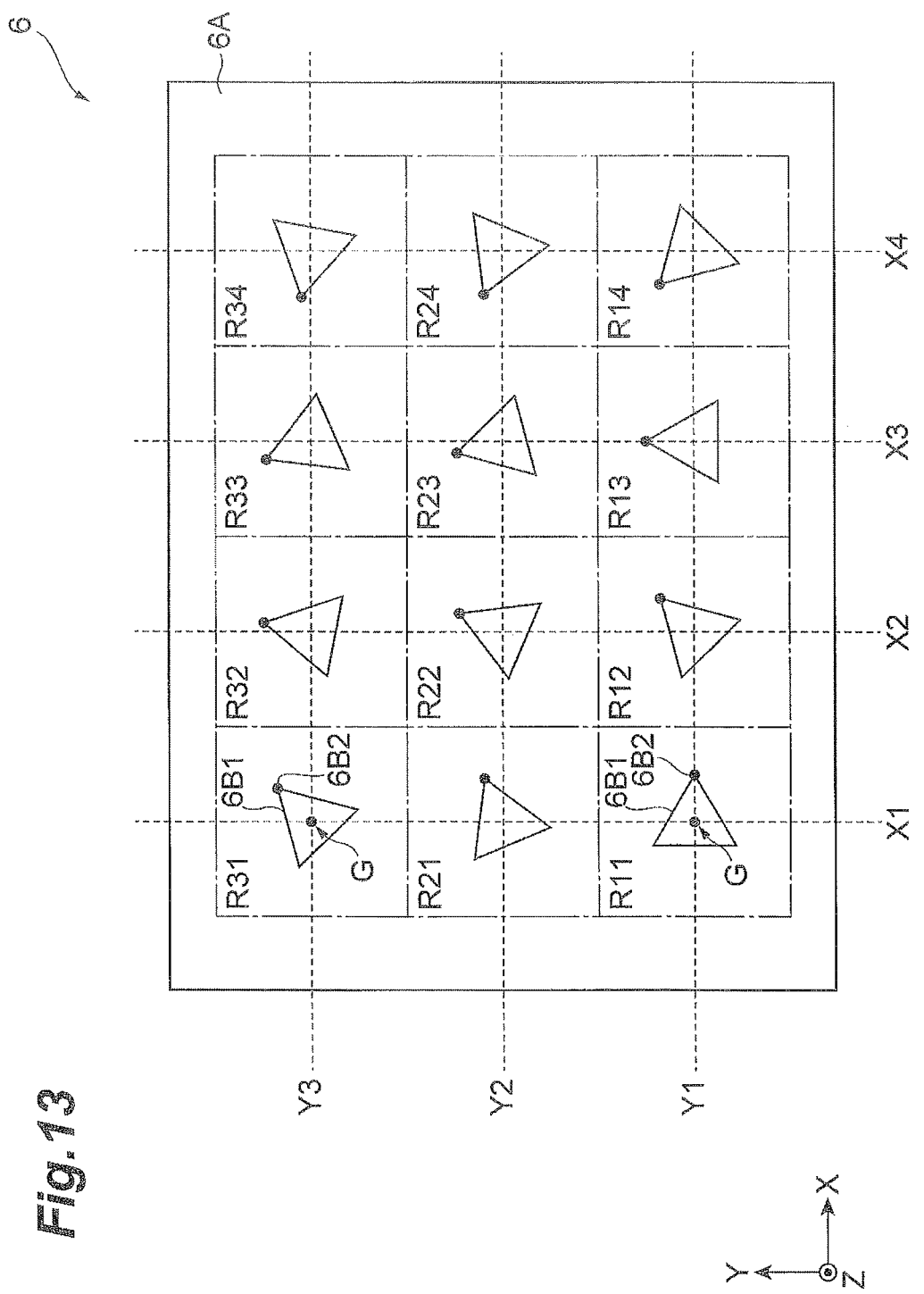
FIG. 13 is a plan view of a photonic crystal layer.

FIG. 13 is a plan view of a photonic crystal layer.

What is illustrated in FIG. 13 differs from what is illustrated in FIG. 8 in that φ is a function of Y as well as a function of X. That is, φ increases at equal intervals in proportion to an increase in X, and φ also increases at equal intervals in proportion to an increase in Y. The function is given as $\phi=\phi_0+aX+bY$ ($\phi_0$ is an integer, a is an integer other than 0, and b is an integer other than 0). The function can be applied to all or a specific area of the photonic crystal layer.

Figure 14:
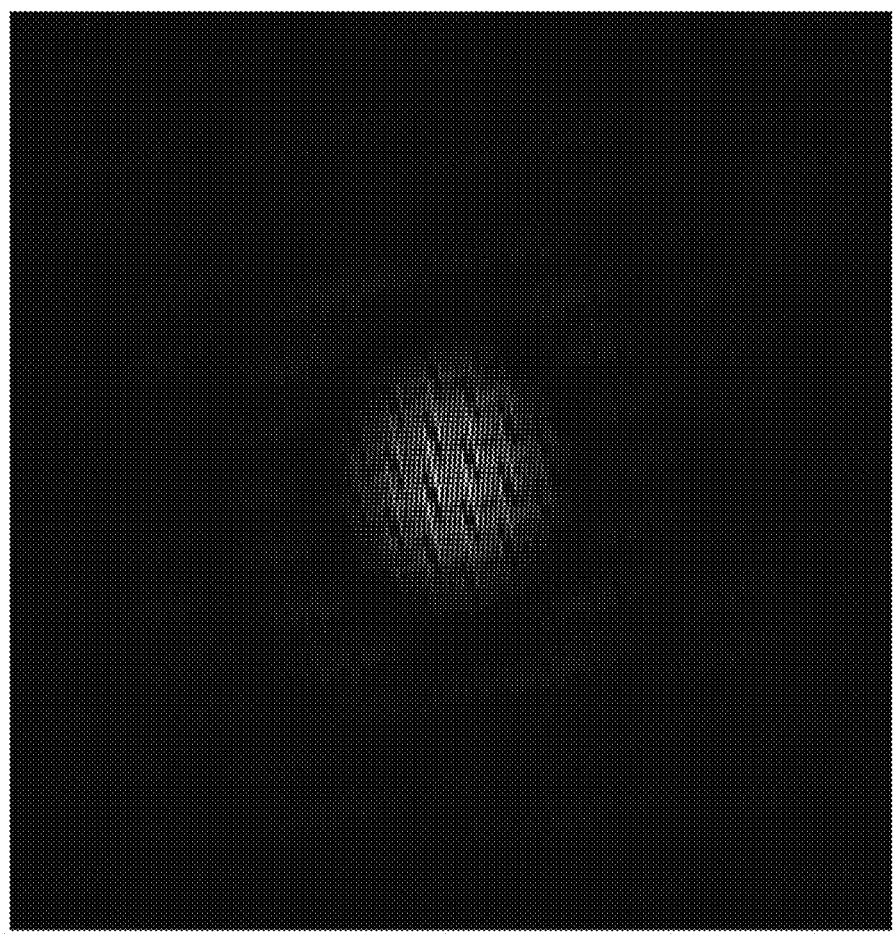
FIG. 14 is a diagram illustrating an intensity distribution pattern of emission light.

FIG. 14 is a diagram illustrating an intensity distribution pattern of emission light after passing through a polarizing plate.

Figure 15:
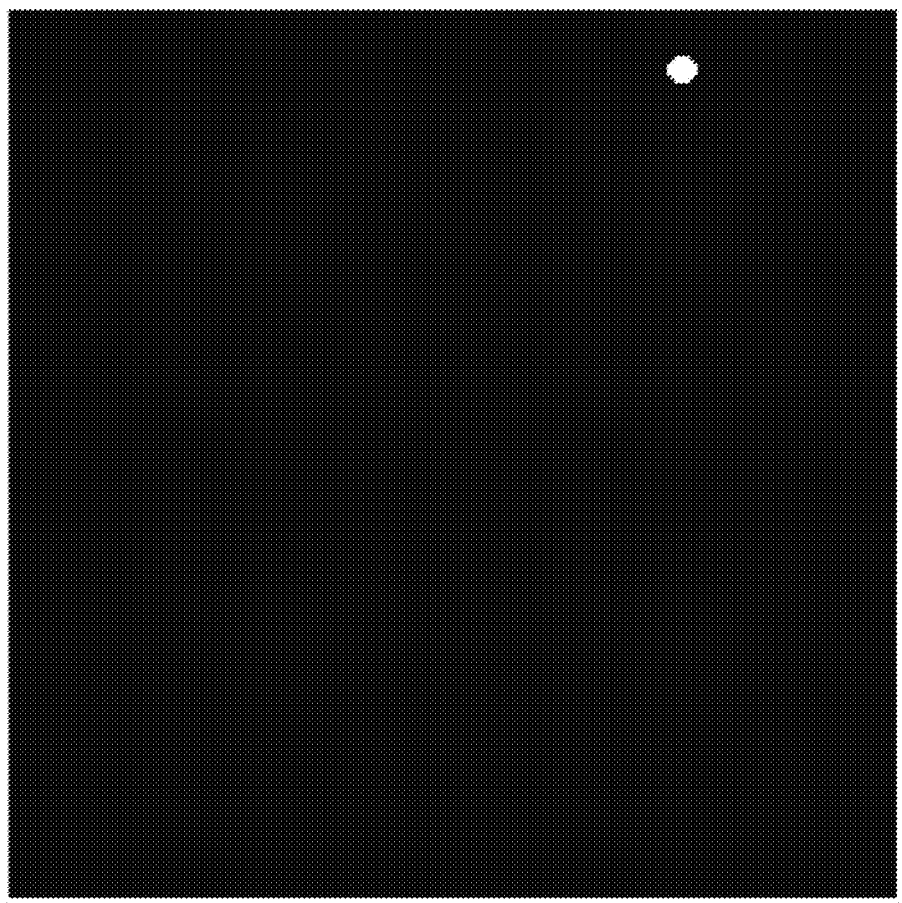
FIG. 15 is a far-field image after the Fourier transformation.

In FIG. 14, colors represent intensity distribution (corresponding to φ) of laser light at each position (coordinates) and intensities of 0 to the maximum correspond to black to white. In this case, a shape or far-field image of the laser beam after passing through a lens or a hologram are as illustrated in, for example, FIG. 15. A center of FIG. 14 corresponds to a position extending from a center of a light emitting surface of a device in a vertical direction, that is, a position extending from a center of the photonic crystal layer in a vertical direction. A white portion corresponds to a shape of a laser beam. In this case, the shape of the laser beam is a spot (circle).

In addition, it is possible to realize a certain phase distribution by using a method according to the present invention. In other words, it is possible to realize a collection of point light sources, having a certain intensity distribution. Since a far-field image obtained from the collection of point light sources is obtained by performing Fourier transformation on an intensity distribution of the point light sources, a certain far-field image can be obtained if a certain intensity distribution is realized. Specifically, when the phase distribution obtained by performing Fourier transformation on a desired far-field image is arranged according to a method of the present invention, a certain far-field image can be obtained. Examples of an intensity distribution pattern will be described below.

Figure 16:
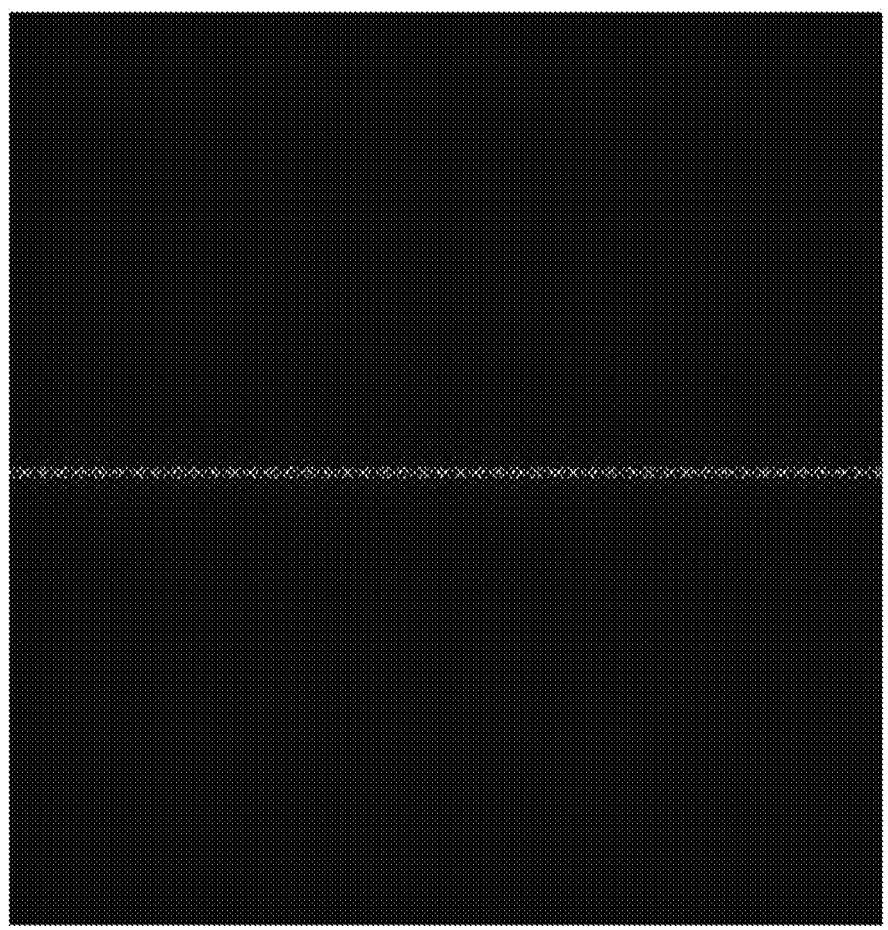
FIG. 16 is a diagram illustrating an intensity distribution pattern of emission light.

FIG. 16 is a diagram illustrating an intensity distribution pattern of emission light.

Figure 17:
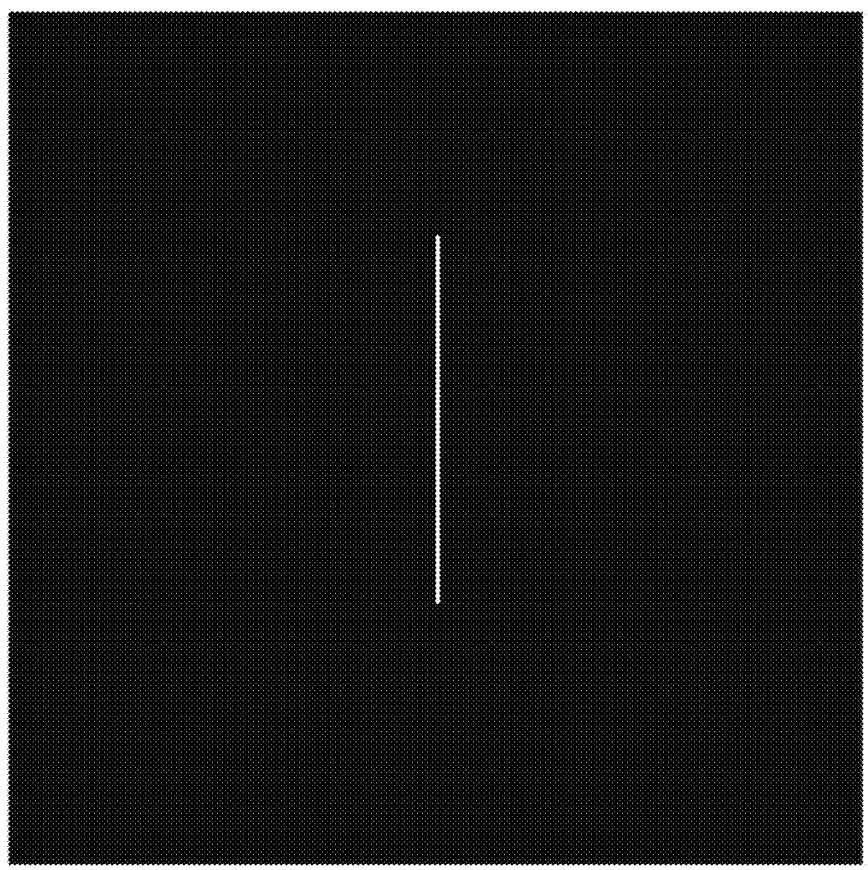
FIG. 17 is a far-field image after the Fourier transformation.

In FIG. 16, colors represent intensity distribution (corresponding to φ) of laser light at each position (coordinates) and intensities of 0 to the maximum correspond to black to white. In this case, a shape or far-field image of the laser beam after passing through a lens or a hologram are as illustrated in, for example, FIG. 17. A center of FIG. 16 corresponds to a position extending from a center of a light emitting surface of a device in a vertical direction, that is, a position extending from a center of the photonic crystal layer in a vertical direction. A white portion corresponds to a shape of a laser beam. In this case, it is possible to obtain a laser beam having a line pattern along a Y axis direction.

Figure 18:
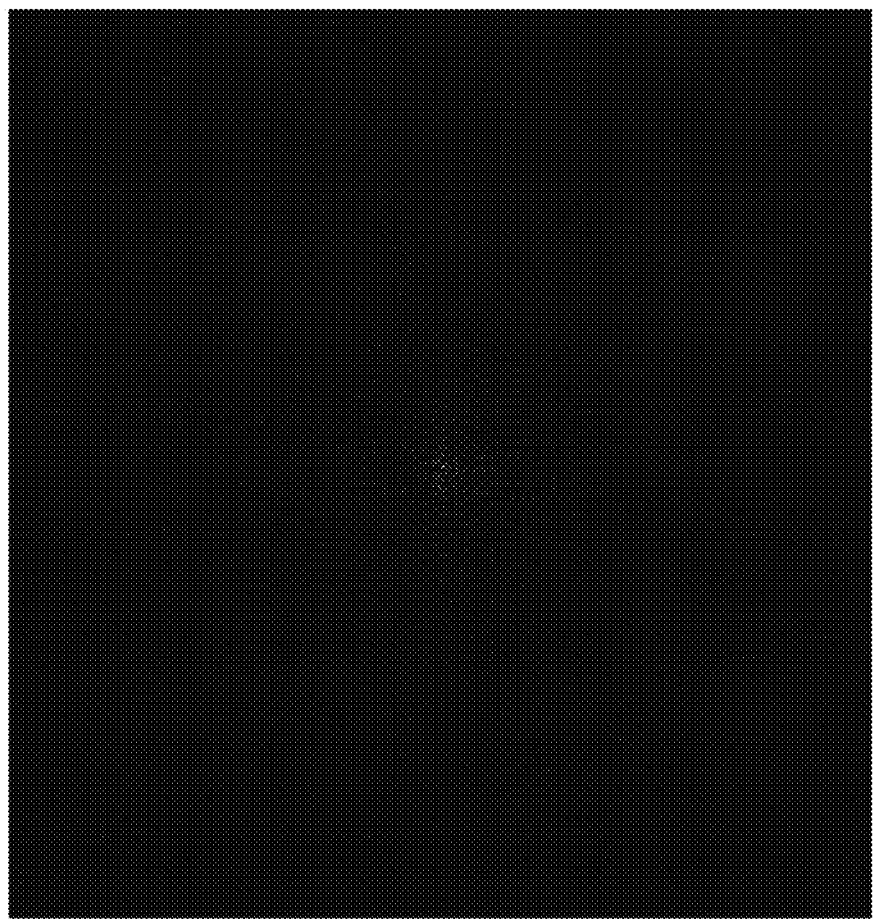
FIG. 18 is a diagram illustrating an intensity distribution pattern of emission light.

FIG. 18 is a diagram illustrating an intensity distribution pattern of emission light.

Figure 19:
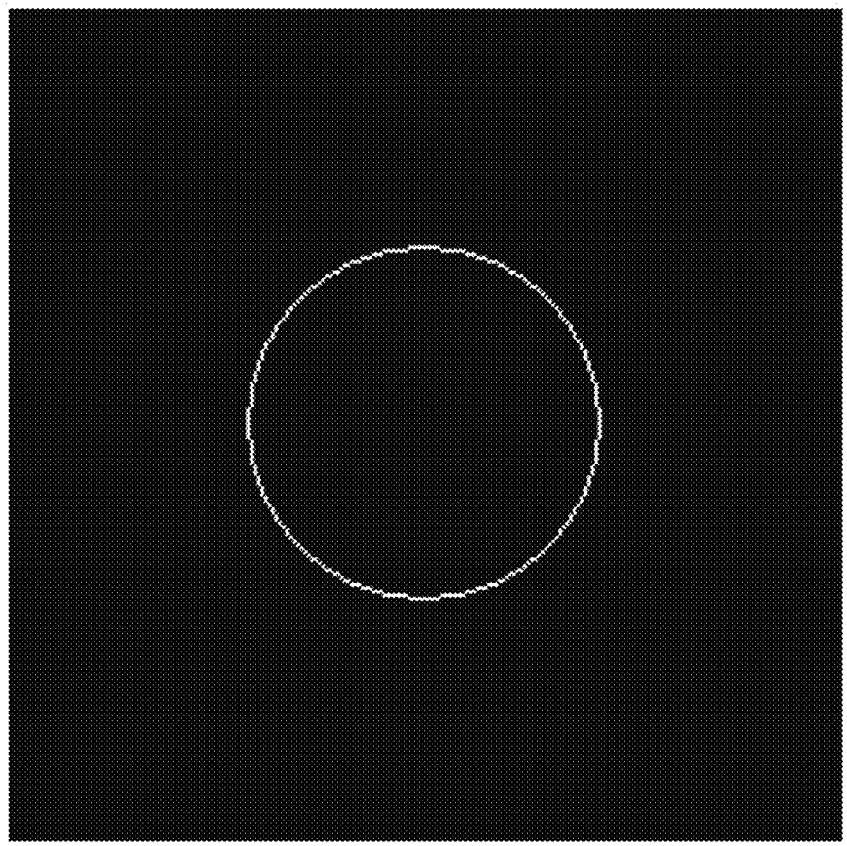
FIG. 19 is a far-field image after the Fourier transformation.

In FIG. 18, colors represent intensity distribution (corresponding to ϕ) of laser light at each position (coordinates) and intensities of 0 to the maximum correspond to black to white. In this case, a shape or far-field image of the laser beam after passing through a lens or a hologram are as illustrated in, for example, FIG. 19. A center of FIG. 18 corresponds to a position extending from a center of a light emitting surface of a device in a vertical direction, that is, a position extending from a center of the photonic crystal layer in a vertical direction. A white portion corresponds to a shape of a laser beam. In this case, it is possible to obtain laser beam with an annular pattern.

Figure 20:
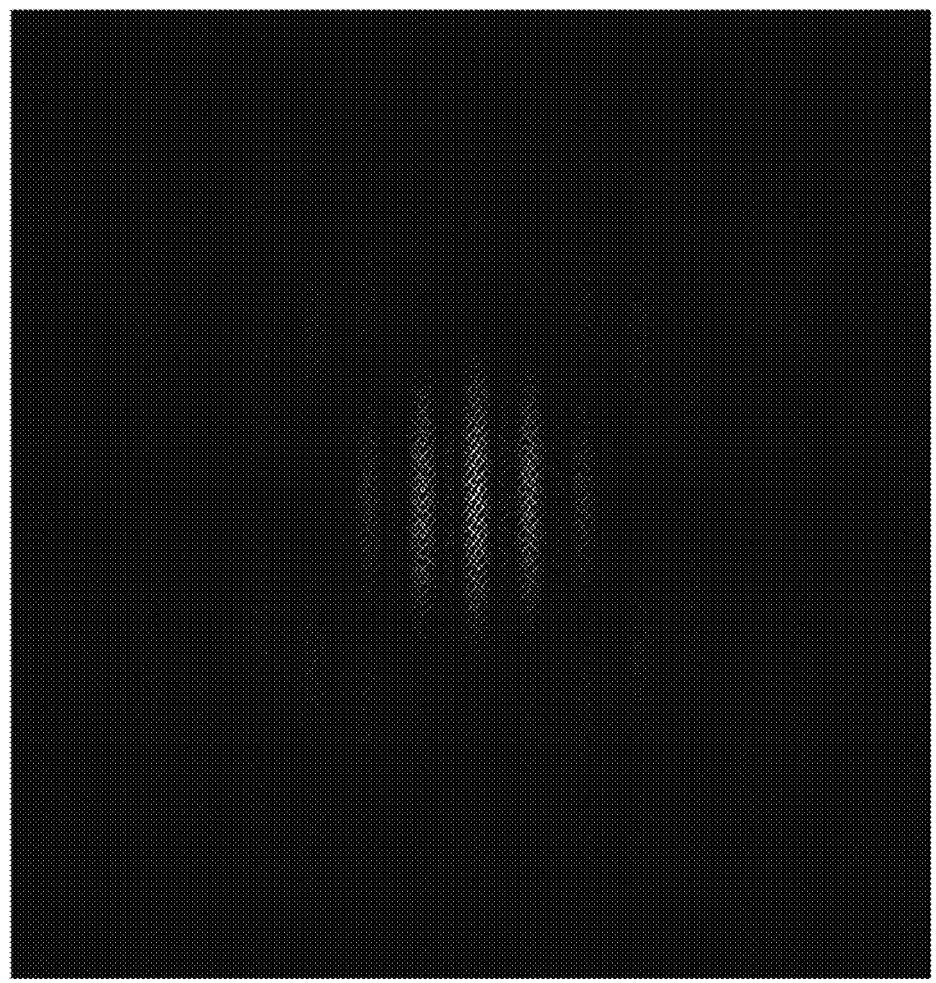
FIG. 20 is a diagram illustrating an intensity distribution pattern of emission light.

FIG. 20 is a diagram illustrating an intensity distribution pattern of emission light.

Figure 21:
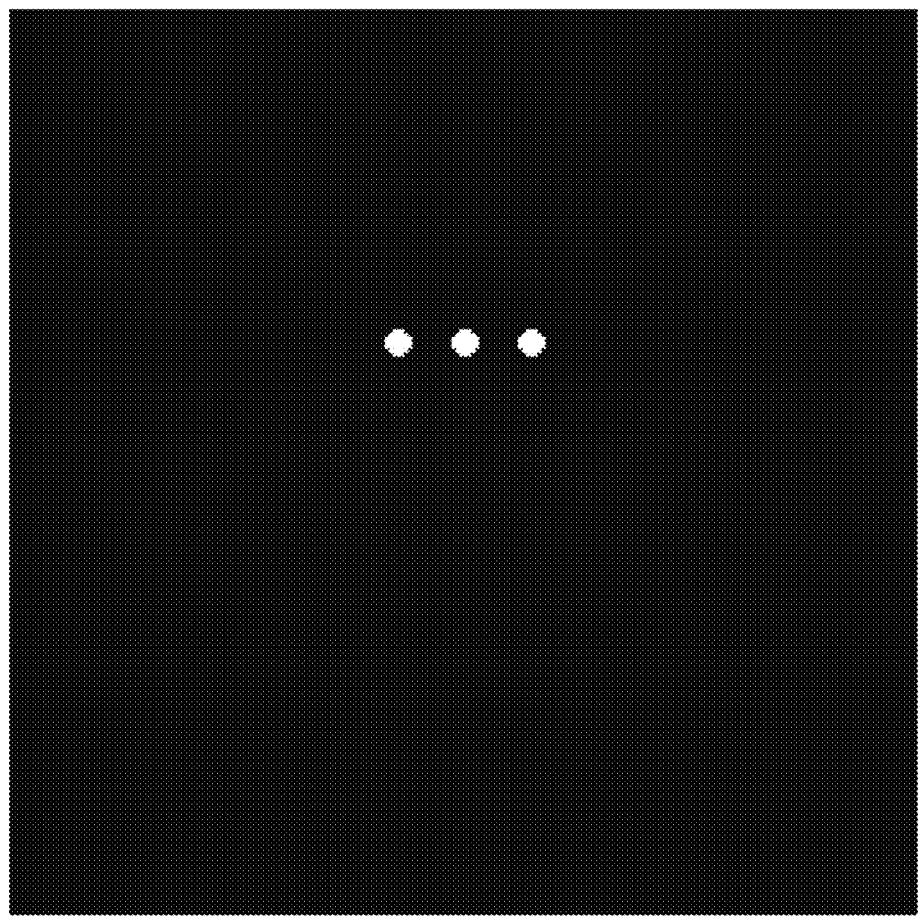
FIG. 21 is a far-field image after the Fourier transformation.

In FIG. 20, colors represent intensity distribution (corresponding to ϕ) of laser light at each position (coordinates) and intensities of 0 to the maximum correspond to black to white. In this case, a shape or far-field image of the laser beam after passing through a lens or a hologram are as illustrated in, for example, FIG. 21. A center of FIG. 20 corresponds to a position extending from a center of a light emitting surface of a device in a vertical direction, that is, a position extending from a center of the photonic crystal layer in a vertical direction. A white portion corresponds to a shape of a laser beam. In this case, it is possible to obtain a three-point multi-spot laser beam.

Figure 22:
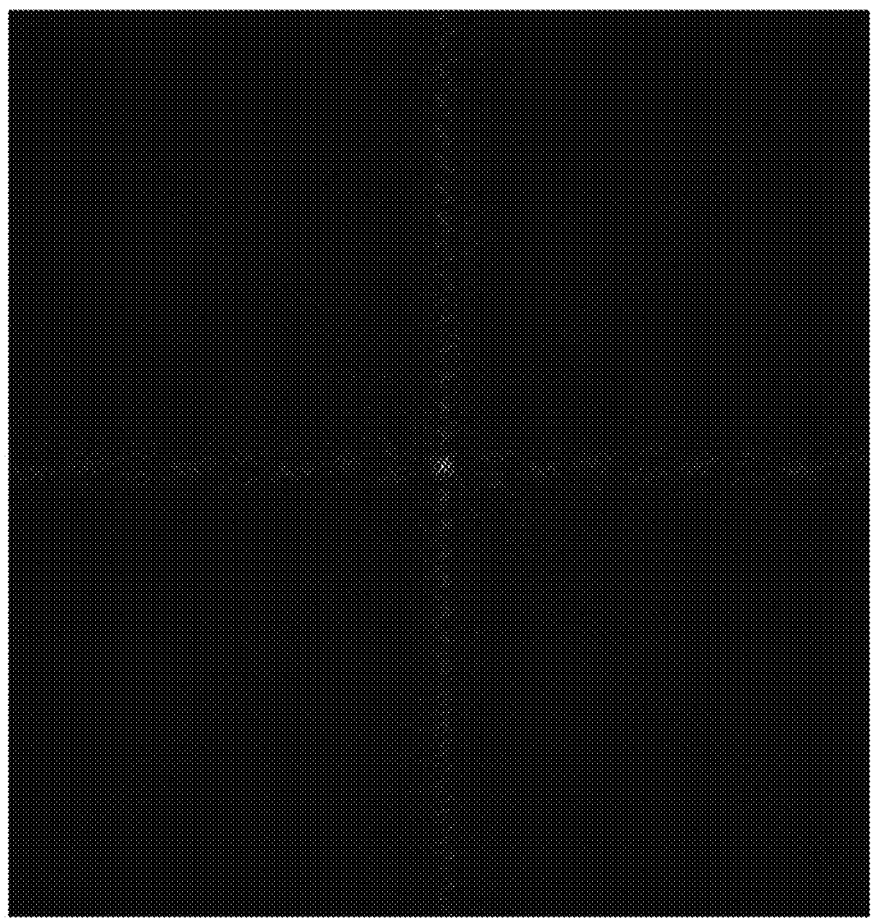
FIG. 22 is a diagram illustrating an intensity distribution pattern of emission light.

FIG. 22 is a diagram illustrating an intensity distribution pattern of emission light.

Figure 23:
FIG. 23 is a far-field image after the Fourier transformation.

In FIG. 22, colors represent intensity distribution (corresponding to ϕ) of laser light at each position (coordinates) and intensities of 0 to the maximum correspond to black to white. In this case, a shape or far-field image of the laser beam after passing through a lens or a hologram are as illustrated in, for example, FIG. 23. A center of FIG. 22 corresponds to a position extending from a center of a light emitting surface of a device in a vertical direction, that is, a position extending from a center of the photonic crystal layer in a vertical direction. A white portion corresponds to a shape of a laser beam. In this case, it is possible to obtain a laser beam with a character shape of "光 ((light))".

Figure 24:
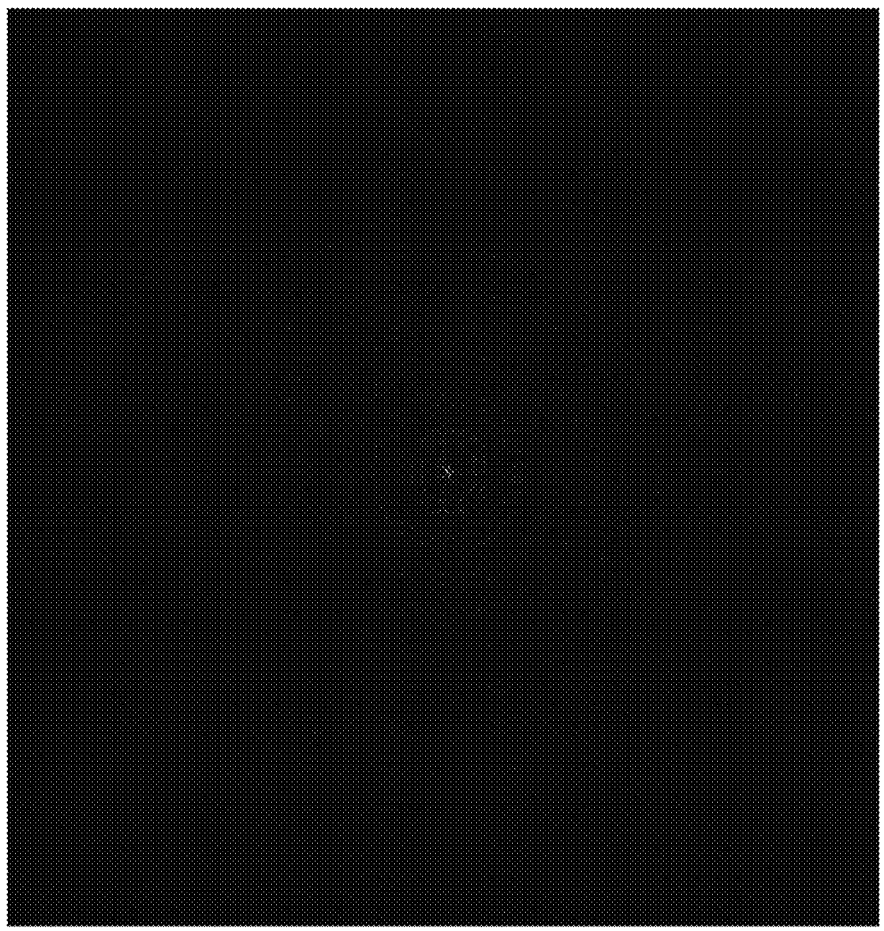
FIG. 24 is a diagram illustrating an intensity distribution pattern of emission light.

FIG. 24 is a diagram illustrating another phase distribution pattern of a different refractive index region.

Figure 25:
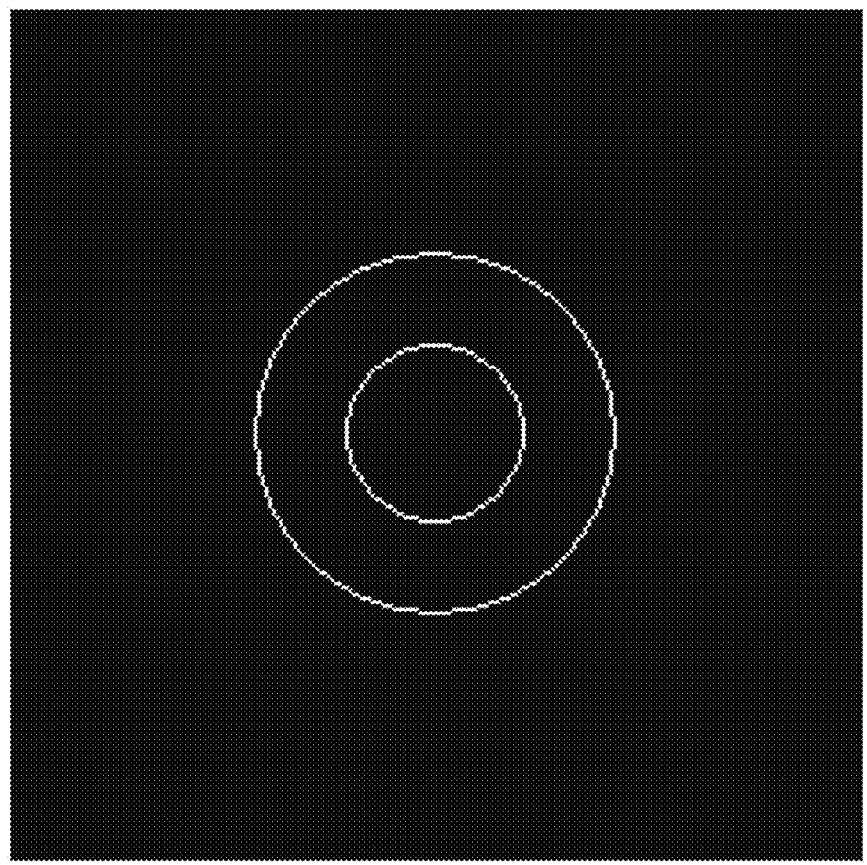
FIG. 25 is a far-field image after the Fourier transformation.

In FIG. 24, colors represent intensity distribution (corresponding to ϕ) of laser light at each position (coordinates) and phases of 0 to the maximum correspond to black to white. In this case, a shape or far-field image of the laser beam after passing through a lens or a hologram are as illustrated in, for example, FIG. 25. A center of FIG. 24 corresponds to a position extending from a center of an light emitting surface of a device in a vertical direction, that is, a position extending from a center of the photonic crystal layer in a vertical direction. A white portion corresponds to a shape of a laser beam. In this case, it is possible to obtain a double-annular laser beam.

Figure 26:
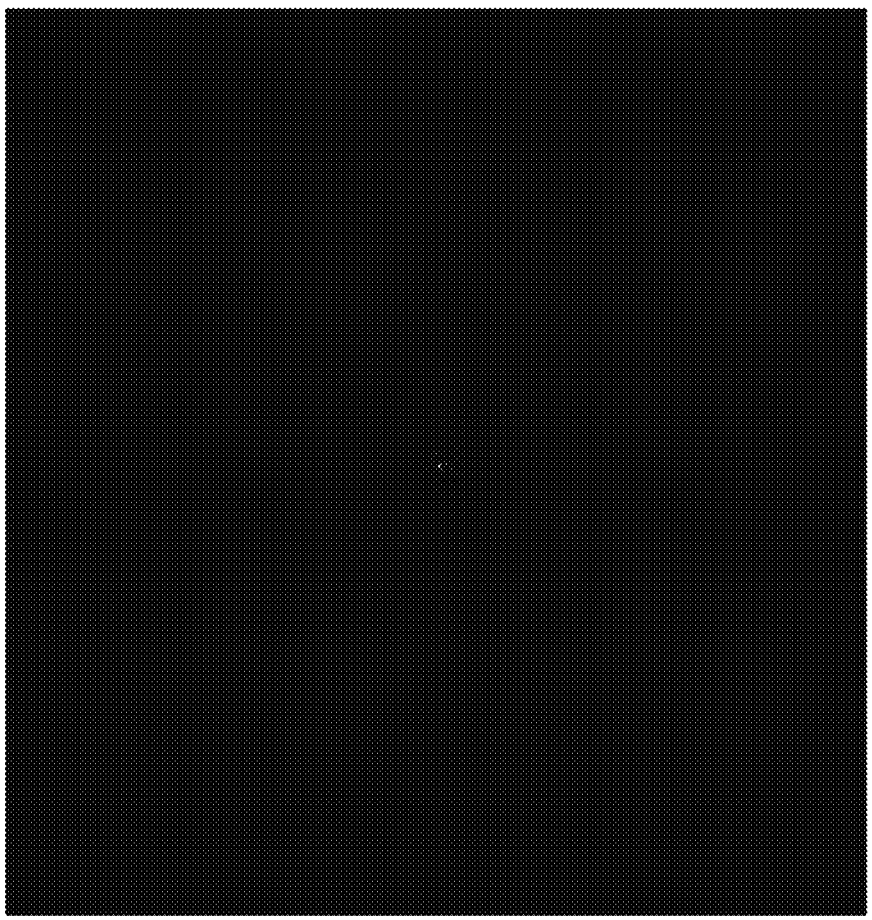
FIG. 26 is a diagram illustrating an intensity distribution pattern of emission light.

FIG. 26 is a diagram illustrating an intensity distribution pattern of emission light.

Figure 27:
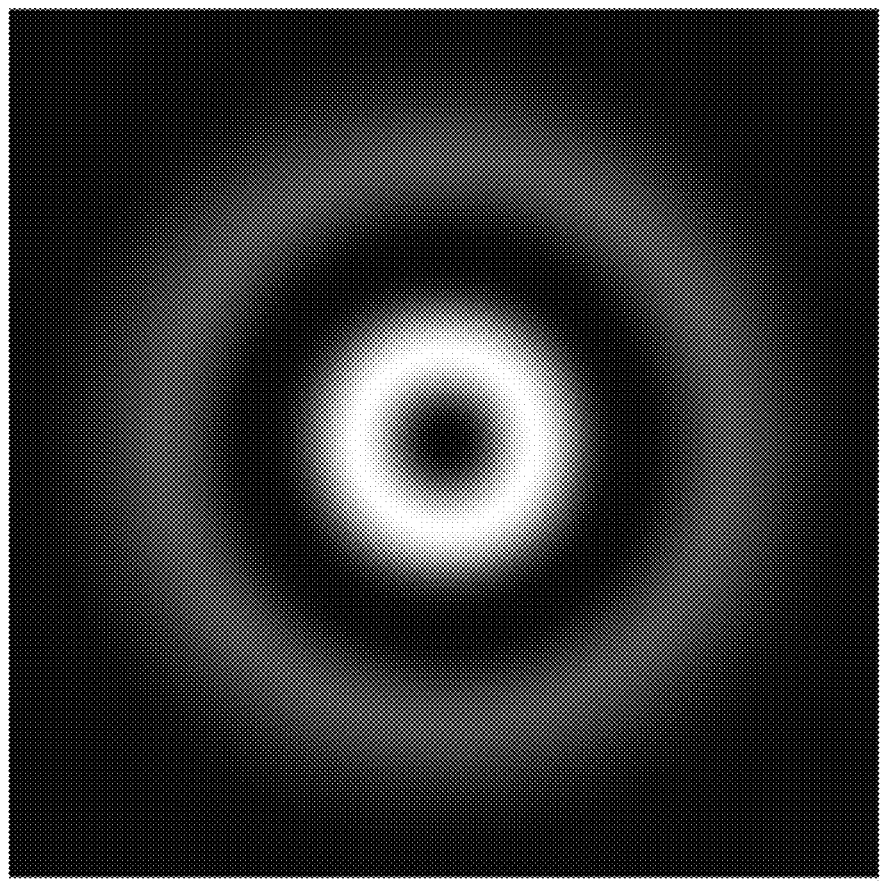
FIG. 27 is a far-field image after the Fourier transformation.

In FIG. 26, colors represent intensity distribution (corresponding to ϕ) of laser light at each position (coordinates) and intensities of 0 to the maximum correspond to black to white. In this case, a shape or far-field image of the laser beam after passing through a lens or a hologram are as illustrated in, for example, FIG. 27. A center of FIG. 26 corresponds to a position extending from a center of a light emitting surface of a device in a vertical direction, that is, a position extending from a center of the photonic crystal layer in a vertical direction. A white portion corresponds to a shape of a laser beam. In this case, it is possible to obtain a vector beam called a Laguerre-Gaussian beam.

As described above, a far-field image after Fourier transformation of a laser beam can have various shapes, such as a single- or multiple-spot shape, an annular shape, a linear shape, a character shape, a double-annular shape, or a Laguerre-Gaussian beam shape.

As described above, in the case of the aforementioned structure, a variation in laser light from the respective different refractive index regions 6B (6B1) occurs, and therefore, an intensity in a specific direction increases. That is, a specific polarization is caused. Here, since the rotation angle ϕ from a center toward one point on a contour of the plane shape is a function of coordinates, when spatial coordinates are changed, a polarization direction of each laser light (intensity after passing through a polarizing plate) is changed. Therefore, it is possible to consider each of the different refractive index regions as a point light source, and it is possible to change it's intensity for each coordinate according to a position of the rotation angle ϕ. When it is possible to adjust the intensity of each of point light sources which are two-dimensionally distributed, it is possible to emit various laser beam patterns.

As described above, a far-field image of a point light source group which is two-dimensionally distributed can be considered as a Fourier transformation image of a point light source group. In the case of configuring a circular laser beam spot by Fourier transformation, an intensity of each point light source may be set by performing circle inverse-Fourier transformation at a specific position. That is, when each rotational angle ϕ is correspondingly set to an intensity of each point light source in case of performing the circle inverse-Fourier transformation at the specific position, it is possible to obtain a circle laser beam spot at the specific position. In order words, it is possible to obtain a spot having a unimodal two-dimensional intensity distribution at a position in an oblique direction.

Also, laser beam emission angles are different, and the aforementioned laser device includes any of the above plurality of laser elements, which are one- or two-dimensionally arranged, and a driving circuit that drives the laser element, and outputs a laser beam in a plurality of directions. The device can function as a pseudo laser beam scanning device.

Although each of the different refractive index regions 6B1 is described as having an approximate triangle, each of the different refractive index regions 6B1 may have an approximate ellipse in which a flatness ratio is not zero. The approximate triangle or the approximate ellipse is designed to have a triangle or a ellipse, but are intended to include shapes which are distorted little upon manufacture.

Figure 29:
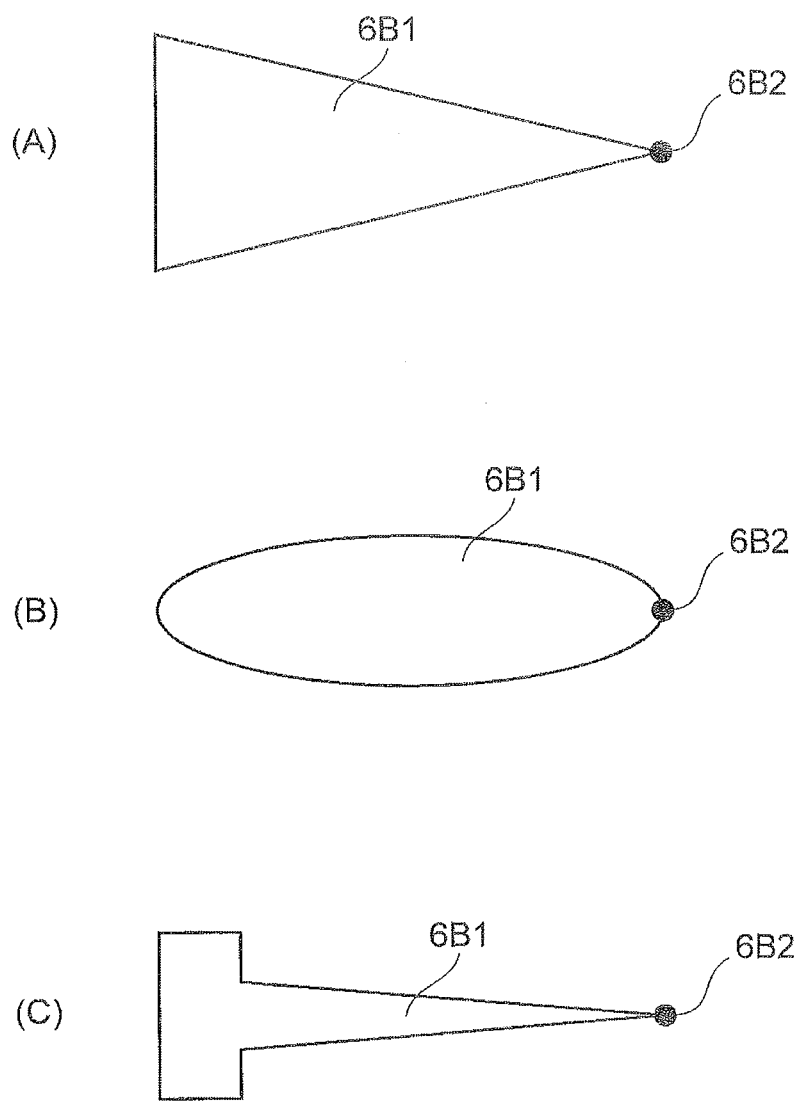
FIG. 29 is XY plane views illustrating shapes of respective different refractive index regions 6B1.

FIG. 29 is XY plane views illustrating shapes of respective different refractive index regions 6B1. As illustrated in FIG. 29(A), the different refractive index region 6B1 inside a hole of the base layer 6A may have an approximate elongated isosceles triangle. In this case, the electric field intensity increases in a polarization direction from the lower side to the apex 6B2. As illustrated in FIG. 29(B), the different refractive index region 6B1 inside the hole of the base layer 6A may have an approximate elongated ellipse in which a flatness ratio is not zero. In this case, the electric field intensity increases in a polarization direction along a major axis. Also, when the different refractive index region 6B1 inside the hole of the base layer 6A may have a non-rotational symmetric shape, such as a combined shape of a triangle and a rectangle, as illustrated in FIG. 29(C), the electric field intensity increases in a specific polarization direction due to non-rotational symmetry. In the case of FIG. 29, the electric field intensity increases in a longitudinal direction (X axis direction).

When the different refractive index regions having the plane shape as described above are two-dimensionally arranged as illustrated in FIG. 8 or FIG. 13, the electric field vector directing the one point 6B2 on the contour remains, and therefore, it is possible to emit a laser beam only in one diagonal direction by forming the phase distribution as described above.

Among the aforementioned structures, the structure including the active layer 4 and the photonic crystal layer 6 has freedom in a material system, a thickness, a layer configuration. When the laser element is manufactured, each compound semiconductor layer is manufactured by a metal organic chemical vapor deposition (MOCVD). Crystal growth is performed on a (001) plane of the semiconductor substrate 1 but the present invention is not limited thereto. When a laser element is manufactured by using the aforementioned AlGaN, a growth temperature of AlGaAs is in a range of 500° C. to 850° C., and upon experiment, a temperature of 550° C. to 700° C. is used. Upon growth, TMA (trimethyl aluminum) is used as an Al raw material, TMG (trimethyl gallium) and TEG (triethyl gallium) are used as a gallium raw material, $AsH_3$ (arsine) is used as an As raw material, $Si_2H_6$ (disilane) is used as a raw material for N-type impurity, and DEZn (diethyl zinc) is used as a raw material for P-type impurity. In GaAs growth, TMG and arsine are used, but TMA is not used. InGaAs is manufactured by using TMG, TMI (trimethyl indium), and arsine. Formation of an insulation film may be formed by performing sputtering on a target using its composition materials as raw materials.

That is, the aforementioned laser element is manufactured by sequentially and epitaxially growing, on an N-type semiconductor substrate (GaAs) 1, an N-type cladding layer (AlGaAs) 2, a guide layer (AlGaAs) 3, a multiple quantum well structure (InGaAs/AlGaAs) 4, a light guide layer (GaAs/AaGaAs) 5, a base layer (GaAs) 6A using MOCVD (metal organic chemical vapor deposition). Subsequently, in order to make an alignment after the epitaxial growth, an SiN layer is formed on the base layer 6A and then, a resist is formed on the SiN layer, by the PCVD (plasma CVD) method. Furthermore, the resist is exposed and developed, and the SiN layer is etched using the resist as a mask, causing the SiN layer to be partially left to form an alignment mark. Remaining resist is removed.

Next, a separate resist is coated on the base layer 6A, and a two-dimensional fine pattern is drawn on the resist using an alignment mark as a reference by an electron beam drawing device and is developed, forming the two-dimensional fine pattern on the resist. Thereafter, the two-dimensional fine pattern having a depth of about 100 nm is transferred onto the base layer 6A by dry etching using the resist as a mask to form a hole (bore) and the resist is removed. The depth of the hole is 100 nm. A compound semiconductor which becomes the different refractive index region 6B (AlGaAs) is regrown within the hole to more than the depth of the hole. An upper cladding layer (AlGaAs) 7 and a contact layer (GaAs) 8 are sequentially formed by MOCVD, and appropriate electrode material is formed on upper and lower surfaces of the substrate by a deposition method or a sputtering method, forming first and second electrodes. Also, if required, it is possible to form an insulation film on the upper and lower surfaces of the substrate by a sputtering method or the like.

When the photonic crystal layer is deposited under the active layer, the photonic crystal layer may be formed on the lower cladding layer before formation of the active layer and the lower light guide layer.

In the case of manufacturing a laser element body including no photonic crystal layer, this manufacturing process may be omitted. Also, a columnar different refractive index region air may be made as a cavity, and air or a gas such as nitrogen or argon may be filled therein. Also, in the aforementioned square lattice, an interval between the vertical and horizontal lattice lines is a degree obtained by dividing the wavelength by an equivalent refractive index, and specifically, it is preferable to set about 300 nm. It is also possible to dispose the different refractive index region at a lattice point position in a triangular lattice, rather than a lattice point position in a square lattice. In the case of the triangular lattice, an interval between horizontal and oblique lattice lines is approximately obtained by dividing a wavelength by an equivalent refractive index and also dividing the wavelength by Sin 60°, and specifically, it is preferable to be set to about 350 nm.

In the case of a square lattice having a lattice interval a, when the unit vectors of orthogonal coordinates are set to x and y, fundamental translation vectors are $a_1=ax$, $a_2=ay$, and the reciprocal lattice fundamental vectors for the translation vectors $a_1$ and $a_2$ are $b_1=(2\pi/a)y$ and $b_2=(2\pi/a)x$. In a case where a wave vector in an energy band gap of photonic crystal is $k=nb_1+mb_2$ (n and m are arbitrary integers), it is possible to obtain a resonance mode (standing wave in XY plane) in which a wave number k becomes a Γ point, and the lattice interval a is identical to a wavelength λ. In addition, the mode A is a mode in which the lowest frequency is provided, and the mode B is a mode in which the second lowest frequency is provided.

Also, intensity modulation is performed on the in-plane electromagnetic field distribution of a standing wave in the aforementioned photonic crystal layer (in-plane polarization distribution of a point light source) through a polarizing plate. Thereafter, a shape obtained by performing Fourier transformation can be formed to be not only a unimodal beam (spot), but also a character shape, a group of two or more spots having the same shape, a vector beam, or the like, as described above.

It is preferable that a refractive index of the base layer 6A is in a range of 3.0 to 3.5, and a refractive index of the different refractive index region 6B is in a range of 1.0 to 3.4. Also, it is preferable that the different refractive index regions 6B1 inside the holes of the base layer 6A have an average maximum diameter in the range of 38 nm to 76 nm.

In addition, in the case of a non-rotational symmetric shape, it is preferable that the average maximum diameter may have three or more values when φ is in a range of more than 0 and less than 2π (rad), along the X axis direction.

As described above, any laser element as described above is also a laser element including a photonic crystal layer on which laser beam is incident, and a plurality of different refractive index regions in the photonic crystal layer has a plane shape that is an approximate triangle, an approximate ellipse in which a flatness ratio is not zero, or a non-rotational symmetric shape. In addition, when XY coordinates of a unit configuration region are (X, Y), the rotation angle φ are different depending on a position (coordinates), and at least three different rotation angles φ are contained in all of the photonic crystal layer. A phase difference is caused according to the rotation angle φ, and therefore, a laser beam in a desired direction can be obtained. The rotation angle φ is a function of X, or a function of X and Y in all or a specific area of the entire photonic crystal layer, and can form a spot.

A collection of spots can constitute a more complicated shape. In the aforementioned laser element, a far-field pattern image of the laser beam emitted in a state of being inclined from a direction perpendicular to a light emitting surface of laser element has a single- or multiple-spot shape, an annular shape, a linear shape, a character shape, a double annular shape, or the Laguerre-Gaussian beam shape. Also, a two-dimensional phase distribution of the image obtained by performing inverse-Fourier transformation on the far-field corresponds to a distribution of the rotation angles φ of the one points 6B2 on the contours of the different refractive index regions at the positions of the unit configuration regions.

Also, depths (thicknesses) of the different refractive index regions 6B constituting the photonic crystal layer may be equal to or different from one another in the XY plane. When the depths are different, a refractive index is changed. Therefore, by adjusting the depths of the different refractive index regions 6B, it is possible to change a phase of emission light.

Figure 30:
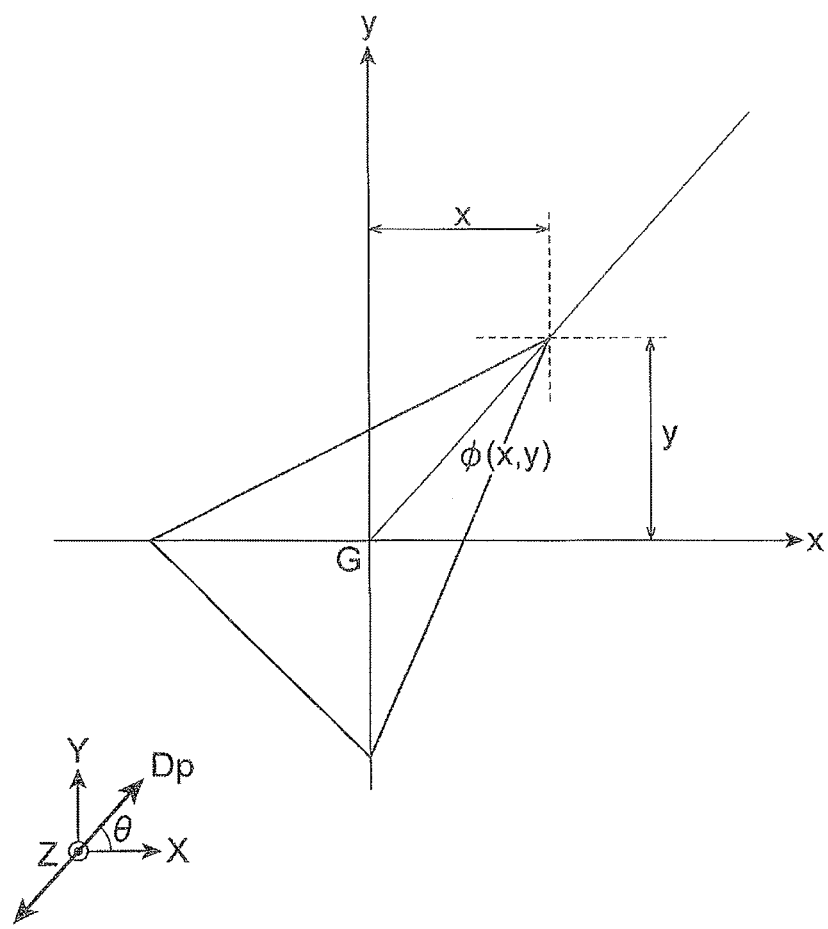
FIG. 30 is a diagram illustrating a positional relationship between different refractive index regions and an electric field distribution.

FIG. 30 is a graph illustrating positions of different refractive index regions.

With respect to a center G of the different refractive index region 6B1, the one point 6B2 (apex) on the contour is disposed at a position of (x, y). An angle between the apex 6B2 and the x axis is φ (x, y).

In this case, an intensity I of laser light after passing through a polarizing plate is represented by the following equation.

$$I(x,y) \propto f(x,y) \times g(\phi,\theta) \times h(FF) \times p(X,Y) = f(x,y) \times g\{(\phi(x,y), \theta) \times h(FF) \times p(X,Y)\}$$

Detailed description will be given below.

f(x, y) is a function representing a change in intensity according to an inter-unit lattice arrangement position (x, y) of the one point 6B2 (apex) on the contour.

FIG. 31 is a diagram illustrating a mode provided by the photonic crystal layer. Referring to FIG. 31, electric field distributions existing in a square lattice structure theory are mode 1 to mode 4. In a configuration in which light is introduced into the photonic crystal layer from the outside, the mode 1 to mode 4 have different resonance frequencies, and therefore, a mode can be selected according to a wavelength of the introduced light. In this case, a mode that is easy to handle is mode 1 or mode 2.

Also, in a configuration where a near center area of the different refractive index region 6B1 is a resonator for oscillation, mode 3 and mode 4 causes a large light leakage from the resonator and has a very low possibility to oscillate, and therefore, either mode 1 or mode 2 has a possibility to oscillate. Accordingly, it is preferable to adopt mode 1 or mode 2.

In the case of mode 1 (FIG. 31(A)), an amplitude of a magnetic field is the maximum at a position of near center area of the different refractive index region 6B1 (a position of A in FIG. 31(A)). In addition, an amplitude of a magnetic field becomes the maximum at points spaced apart from the positions by a half of the lattice interval in the x direction and the y direction (a position of B in FIG. 31(A)). The magnetic field of A and B have phases which are displaced from each other by π. When A and B are referred to as a belly of the magnetic field, electric fields exist so as to surround the belly of the magnetic field. The orientation of an electric field to surround A and the orientation of an electric field to surround B are the opposite to each other in a certain moment. Also, an amplitude of the electric field becomes the maximum value in a central portion of a line connecting A and B adjacent to each other. In addition, the amplitudes of the electric field becomes zero in a central portion of a line connecting A and A adjacent to each other and in a central portion of a line connecting B and B adjacent to each other.

In the case of mode 2 (FIG. 31(B)), an electromagnetic field distribution is distributed as the electromagnetic field distribution of mode 1 is shifted by a half of the lattice interval, in the x direction or the y direction. The electromagnetic field distributions of mode 1 and mode 2 have characteristics as described above f(x, y) is changed depending on an intensity of an electric field in a portion in which the near center area of the different refractive index region 6B1 is disposed.

g(φ, θ) is a function indicating an intensity variation due to a polarization direction φ from the center G to a position of the one point 6B2 on the contour and a transmission axis direction θ of a polarizing plate (where, f is changed by a position (x, y)). When the transmission axis direction θ of the polarizing plate is identical to an polarization direction at φ(x, y), a transmittance becomes high and the intensity increases.

Specifically, $g(\phi, \theta) = I_0 \cos^2(\theta - \phi)$ is given. In this case, $I_0$ is a value determined by light loss due to the polarizing plate, and corresponds to the transmittance of the polarizing plate in the case of θ=φ. φ is the polarization direction of output light at the one point 6B2 on the contour, and θ is a transmission axis direction of the polarizing plate.

h(FF) is a function representing in a change in intensity caused by a position of the one point 6B2 of the contour.

As described above, the electric field distribution of mode 1 or mode 2 has a possibility to use. A triangle is an asymmetric figure, and destructive interference does not occur. The electric field in the xy plane is changed depending on a difference in dielectric constant between the inside and outside of the hole. That is, an electric field component caused by asymmetry causes diffraction in the Z direction. The change due to electric field asymmetry in the xy plane that depends on a change in opening is defined as ha(FF). In addition, FF is a filling factor and refers to a ratio of an area occupied by the different refractive index region 6B occupied in an unit lattice.

p(X, Y) is an intensity distribution function at the position (X, Y) in the photonic crystal layer. It is possible to calculate an envelope intensity distribution of the whole element by using the optical coupling wave theory disclosed in Y Liang et al. "Three-dimensional coupled-wave analysis for square-lattice photonic crystal surface emitting lasers with transverse-electric polarization: finite-size effects," Opt Express 20, 15945-15961 (2012).

FIG. 32 is a diagram illustrating a laser device including a laser element and a polarizing plate.

Laser light having a plurality of polarization directions Dp is output from a light emitting surface of the laser element LD (FIG. 32(A)). The laser light is intensity-modulated by passing through the polarizing plate P. FIG. 32(B). That is, the laser device includes the aforementioned laser element LD, and a polarizing plate P which faces a light emitting surface of the laser element LD.

In the aforementioned laser element, a position of the one point 6B2 on the contour is different between respective unit lattices, and therefore, light having different polarizations for the respective unit lattices can be obtained. Accordingly, by combining a polarizing plate on an emission side, it is possible to obtain plane waves of which intensities are different but phases are aligned with respect to the unit lattices.

In the aforementioned laser element, a plane wave with different intensities for respective unit lattices is obtained as emission light. In other words, a plane wave with different intensities for respective positions is obtained as emission light. When the plane wave with different intensities for respective positions is obtained, it is possible to obtain a hologram using the method described in W. H. Lee, "Sampled fourier transform hologram generated by computer," Appl. Opt. 9, 639-643 (1970). Therefore, it is possible to obtain a certain beam pattern.

When an example is described according to a specific procedure, for example, a desired beam pattern, that is, two-dimensional angle-intensity information is prepared as a two-dimensional array, and two-dimensional discrete Fourier transformation or two-dimensional fast Fourier transformation is performed on the two-dimensional angle-intensity information, thereby obtaining a two-dimensional array with a complex amplitude. In this case, the number of elements of the two-dimensional array of the angle-intensity information of an originally prepared beam pattern is equal to the number of elements of the two-dimensional array with the complex amplitude after transformation. The complex amplitude of each element is composed of a real part and an imaginary part, and the real part and the imaginary part have a positive or negative value, respectively.

According to the method of the aforementioned Lee literature, four divided stripe-shaped regions having the same width correspond to one complex amplitude as described above and intensities of the divided regions are assigned according to the following procedure. In this case, the stripe-shaped regions are defined as a first region, a second region, a third region, and a fourth region sequentially from the left. When a real part of the above complex amplitude has a positive value, a value of the real part of the complex amplitude is assigned to the first region, and zero is assigned to the third region. When the real part of the above complex amplitude has a negative value, zero is assigned to the first region, and an absolute value of the value of the real part of the complex amplitude is assigned to the third region. When the real part of the complex amplitude is 0, 0 is assigned to the first region and the third region. In addition, when an imaginary part of the above complex amplitude has a positive value, a value of the imaginary part of the complex amplitude is assigned to the second region, and zero is assigned to the fourth region. When the imaginary part of the above complex amplitude has a negative value, zero is assigned to the second region, and an absolute value of the value of the imaginary part of the complex amplitude is assigned to the fourth region. When the imaginary part of the complex amplitude is 0, 0 is assigned to the second region and the fourth region. The values assigned as described above are all negative values, and it is possible to perform correspondence of the intensity distributions.

After the intensity distributions are assigned to respective strip-shaped regions according to the aforementioned procedure, a position of the one point 6B2 on the contour are assigned so as to obtain a desired intensity distribution. That is, according to the function $g(\phi, \theta)$ representing an intensity change due to the polarization direction $\phi$ on the contour and the transmission axis direction $\theta$ of the polarizing plate at the position of the one point 6B2 on the contour, the intensity distribution at locations is converted to the arrangement of the one points 6B2 on the contour. According to the aforementioned procedure, it is possible to obtain arrangement of the one points 6B2 on the contour for obtaining a desired beam pattern.

Although, as the method for determining the arrangement of the one points 6B2 on the contour from a desired beam pattern, the method of Lee is provided, the present invention is characterized to obtain a certain intensity distribution in which phases are aligned by the arrangement of the one points 6B2 on the contour, and other methods may be considerable in addition to the method of Lee, as a method of determining the arrangement of the one points 6B2 on the contour. For example, although a method to assign intensity distributions to three strip-shaped regions and obtain a result similar to the method of Lee is disclosed in C. B. Burckhardt, "A simplification of Lee's method of generating holograms by computer," Appl. Opt. 9, 1949 (1970), this method may be used or another method capable of obtaining equivalent results may be used.

FIG. 33 is a diagram illustrating main portions of a laser device including a polarizing plate P and an optical element LS. That is, it is possible to dispose the optical element LS, such as a lens or a hologram, at a subsequent stage of the polarizing plate P. The optical element LS is capable of performing Fourier transformation on incident laser light and output the laser light.

REFERENCE SIGNS LIST

6 . . . photonic crystal layer, 6A . . . base layer, 6B, 6B1 . . . different refractive index region, 6B2 . . . one point on contour

The invention claimed is:

1. A laser element including a photonic crystal layer on which laser light is incident, wherein
the photonic crystal layer comprises:
a base layer formed of a first refractive index medium; and
a plurality of different refractive index regions formed of a second refractive index medium having a refractive index different from that of the first refractive index medium and disposed in the base layer,
the plurality of different refractive index regions has a plane shape that is an approximate triangle, an approximate ellipse in which a flatness ratio is not zero, or a non-rotational symmetric shape,
a unit configuration region is formed of one different refractive index region,
in the unit configuration region, a rotation angle of one point on a contour of the plane shape with respect to a central position of the different refractive index region is denoted by $\phi$,
in an XY plane including an X axis and an Y axis, a plurality of the unit configuration regions is two-dimensionally arranged,
XY coordinates of each of the unit configuration regions is given to a central position of the different refractive index region,
when the XY coordinates of the unit configuration region are (X, Y),
the rotation angles $\phi$ are different depending on respective positions, and
the respective rotation angles $\phi$ are set so as to satisfy a two-dimensional phase distribution of an image obtained by performing inverse-Fourier transformation on a far-field pattern image of a laser beam emitted from the laser element corresponding to a distribution of the rotation angles $\phi$ in the respective unit configuration regions.

2. The laser element according to claim 1, further comprising:
an active layer configured to emit the laser light;
upper and lower cladding layers between which the active layer is interposed; and
the photonic crystal layer disposed between the upper or lower cladding layer and the active layer.

3. A laser device, comprising:
the laser element according to claim 1; and
a polarizing plate disposed to face a light emitting surface of the laser element.

4. A laser device, comprising:
the laser element according to claim 2; and
a polarizing plate disposed to face a light emitting surface of the laser element.

5. The laser element according to claim 1, wherein at least three different rotation angles $\phi$ are contained in all of the photonic crystal layer.

6. The laser element according to claim 1, wherein a laser beam is inclined from a direction perpendicular to a light emitting surface of the laser element.

7. The laser element according to claim 5, wherein a laser beam is inclined from a direction perpendicular to a light emitting surface of the laser element.

* * * * *